(12) United States Patent
Takemura

(10) Patent No.: US 8,958,263 B2
(45) Date of Patent: Feb. 17, 2015

(54) SEMICONDUCTOR DEVICE

(75) Inventor: Yasuhiko Takemura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 447 days.

(21) Appl. No.: 13/479,437

(22) Filed: May 24, 2012

(65) Prior Publication Data
US 2012/0314524 A1    Dec. 13, 2012

(30) Foreign Application Priority Data

Jun. 10, 2011   (JP) ................................. 2011-129728
Jun. 10, 2011   (JP) ................................. 2011-129757

(51) Int. Cl.
| | | |
|---|---|---|
| *G11C 8/00* | (2006.01) | |
| *H01L 27/108* | (2006.01) | |
| *G11C 11/403* | (2006.01) | |
| *H01L 27/115* | (2006.01) | |
| *H01L 27/12* | (2006.01) | |

(52) U.S. Cl.
CPC ............ *H01L 27/108* (2013.01); *G11C 11/403* (2013.01); *H01L 27/1156* (2013.01); *H01L 27/1225* (2013.01)
USPC .... 365/230.06; 365/63; 365/149; 365/189.09

(58) Field of Classification Search
CPC .............. G11C 11/4087; G11C 5/147; G11C 29/12005; G11C 8/08; G11C 8/12
USPC .......................... 365/230.06, 63, 149, 189.09
See application file for complete search history.

(56) References Cited

U.S. PATENT DOCUMENTS

| | | |
|---|---|---|
| 4,777,625 A | 10/1988 | Sakui et al. |
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Tuan T Nguyen
(74) *Attorney, Agent, or Firm* — Fish & Richardson P.C.

(57) ABSTRACT

An object is to increase the retention characteristics of a memory device formed using a wide bandgap semiconductor. A bit line controlling transistor is inserted in a bit line in series. The minimum potential of a gate of the transistor is set to a sufficiently negative value. The gate of the transistor is connected to a bit line controlling circuit connected to a battery. The minimum potential of the bit line is set higher than that of a word line. When power from an external power supply is interrupted, the bit line is cut off by the transistor, ensuring prevention of outflow of charge in the bit line. The potential of a source or a drain (bit line) of a cell transistor is sufficiently higher than that of a gate of the cell transistor, resulting in an absolute off-state; thus, data can be retained. Other embodiments are disclosed.

23 Claims, 13 Drawing Sheets

(56) References Cited

U.S. PATENT DOCUMENTS

| | | | |
|---|---|---|---|
| 5,793,686 A * | 8/1998 | Furutani et al. | 365/201 |
| 5,872,737 A * | 2/1999 | Tsuruda et al. | 365/189.05 |
| 5,953,261 A * | 9/1999 | Furutani et al. | 365/189.05 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0101351 A1 | 5/2011 | Yamazaki | |
| 2011/0156027 A1 | 6/2011 | Yamazaki et al. | |
| 2011/0182110 A1 | 7/2011 | Yamazaki et al. | |
| 2011/0317474 A1 | 12/2011 | Kato | |
| 2012/0014157 A1 | 1/2012 | Kato et al. | |
| 2012/0033506 A1 * | 2/2012 | Furutani et al. | 365/189.07 |
| 2012/0292613 A1 | 11/2012 | Shionoiri et al. | |
| 2013/0301367 A1 * | 11/2013 | Nagatsuka et al. | 365/189.16 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

(56) References Cited

OTHER PUBLICATIONS

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the IN2O3 and Sc2O3-A2O3-BO Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," Nirim Newsletter, Mar. 1995, vol. 150, pp. 1-4 with English translation.

Nakamura, M et al., "The phase relations in the In2O3-Ga2ZnO4-ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

(56) References Cited

OTHER PUBLICATIONS

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTS With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

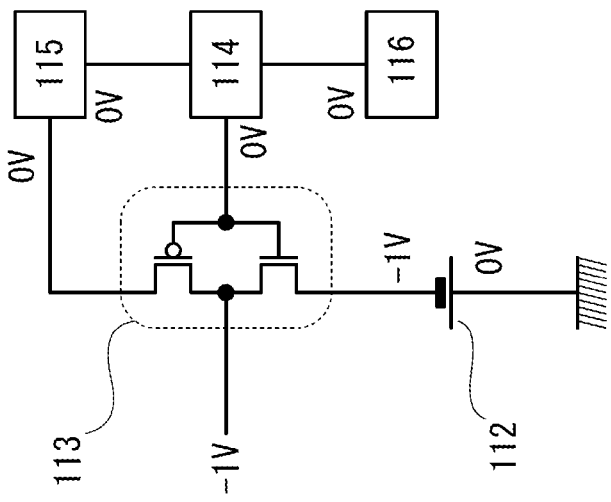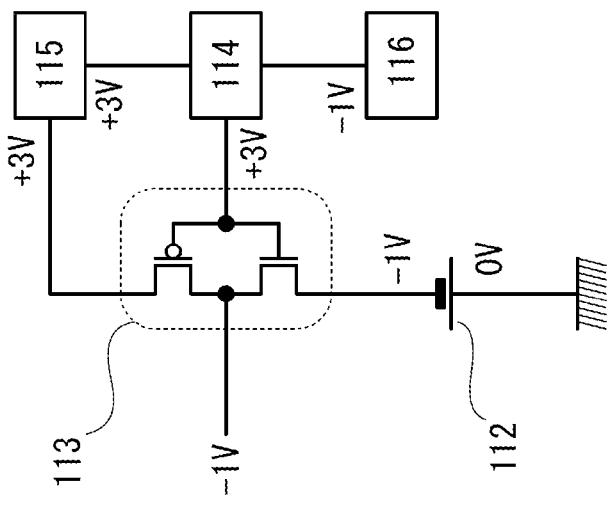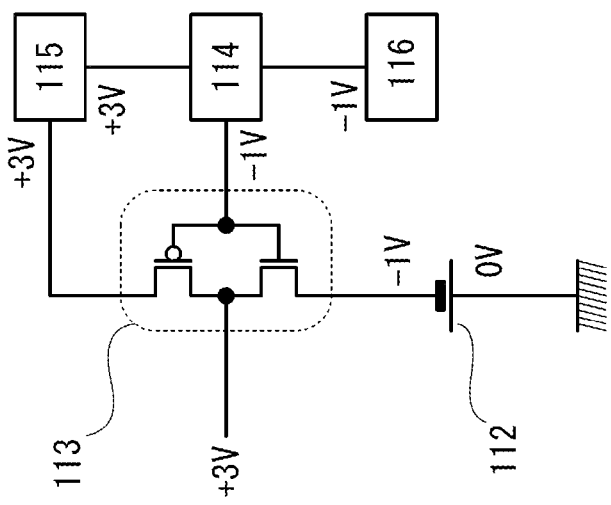

SEMICONDUCTOR DEVICE

BACKGROUND OF THE INVENTION

1. Field of the Invention

The present invention relates to a semiconductor device including a semiconductor memory device.

2. Description of the Related Art

Semiconductor memory devices include dynamic random access memories (DRAMs) (see Patent Document 1, for example). In a DRAM, memory cells 105 each including a cell transistor 106 and a capacitor 107 as illustrated in FIG. 2B are arranged in a matrix as illustrated in FIG. 2A, and a gate and a drain of the cell transistor 106 are connected to a word line 103 and a bit line 104, respectively. Moreover, the DRAM includes a row driver 101 for driving a plurality of word lines and a column driver 102 for driving a plurality of bit lines.

The DRAM is powered by an external power supply to drive the row driver 101 and the column driver 102. Note that a cell transistor formed using silicon semiconductor has a small drain current (off-state current) even in the off-state, and thus requires tens of refresh operations (operations for replenishing the capacitor with charge) per second. In other words, the DRAM needs to be powered by the external power supply to retain a stored state.

In recent years, it has been found that charge can be retained for a very long period of time by utilizing the very low off-state current of transistors formed using an oxide semiconductor whose bandgap is twice or more that of silicon semiconductor. For example, the theoretical off-state current (drain current in the off-state) of a semiconductor with a bandgap of 2.5 electron volts or more is $10^{-26}$ A or less. The use of a memory circuit utilizing this as a nonvolatile memory has been proposed (see Patent Documents 2 to 4).

A transistor used in such a memory needs to exhibit sufficiently high off-resistance (the resistance of the transistor in the off-state), i.e., sufficiently low off-state current. For example, in order to retain charge in a capacitor of 30 fF, which is the capacitance of capacitors used in DRAM in common use, for 10 years, a transistor exhibiting a resistance of as high as $1\times10^{22}\Omega$ or more in the off-state is required. Assuming that the drain voltage is +1 V, the off-state current of the transistor needs to be 100 yA ($1\times10^{-22}$ A) or less.

The drain current of a transistor formed using an oxide semiconductor with a wide bandgap in the subthreshold region can be roughly estimated from the subthreshold value and the threshold voltage. The theoretical lower limit of the subthreshold value at room temperature (27° C.) is 60 mV/decade.

For example, assuming that the threshold voltage is +1 V, the subthreshold value is 60 mV/decade, and the drain current obtained at the threshold voltage is 1 µA (the source potential Vs is 0 V, while the drain potential Vd is +1 V), the drain current is 100 yA with a gate potential Vg of +40 mV. With a gate potential Vg of 0 V, the drain current of the transistor is less than 100 yA, so that the charge in the capacitor can be retained for 10 years.

Note that the retention period is not limited to 10 years, and may be determined in the range from 10 seconds to 100 years depending on intended use. The capacitance of the capacitor or the off-resistance or off-state current of the transistor may be set according to the retention period.

The above-described drain current is obtained at room temperature. In practice, some problems arise here. The subthreshold value depends on temperature. As temperature increases, the subthreshold value increases. Because it is also possible that the semiconductor memory device is stored at a high temperature, sufficient retention characteristics need to be also ensured at a temperature exceeding room temperature.

For example, the theoretical lower limit of the subthreshold value at 95° C. is 74 mV/decade. When the subthreshold value is 74 mV/decade, gate potential Vg with which the drain current becomes 100 yA is −180 mV. When the gate potential Vg is 0 V, the drain current is 10 zA ($1\times10^{-20}$ A), so that charge retention time is 1% of that at room temperature.

As transistor size is decreased, the subthreshold value increases owing to short channel effects. The conductivity type of silicon semiconductor can be controlled by doping. Therefore, in the case of an n-channel transistor, for example, short channel effects can be reduced by increasing the concentration of a p-type dopant in the channel formation region.

In contrast, the conductivity type of an oxide semiconductor cannot be controlled by controlling dopant concentration as in the case of silicon semiconductor. The intensity of one conductivity type of an oxide semiconductor can be changed, but an n-type oxide semiconductor cannot be turned into a p-type one by doping (the conductivity type of an oxide semiconductor cannot be reversed), for example. For this reason, short channel effects cannot be reduced by reversing the conductivity type of the channel formation region.

Therefore, with a channel length of 100 nm or less, the subthreshold value is 100 mV/decade or more, which may cause data loss unless the gate potential Vg is maintained at −0.6 V or less. The threshold voltage is +1 V in the above description; when the threshold voltage is lower, even at room temperature or with a long channel, the gate potential Vg needs to be less than 0 V in order to sufficiently increase the off-resistance. Note that the threshold voltage is dependent on the work function of a material for the gate; thus, it is difficult to increase the threshold voltage to a value higher than +1.5 V.

Under such conditions, data loss may occur when power from the external power supply to the semiconductor memory device is interrupted and the potential of the gate becomes the same as that of the source (i.e., Vg=0 V). Since potential is relative, the potentials of portions of the semiconductor memory device are assumed, in the description below, to become 0 V some time after the interruption of power from the external power supply.

REFERENCE

Patent Document

[Patent Document 1] U.S. Pat. No. 4,777,625
[Patent Document 2] United States Patent Application Publication No. 2011/0101351
[Patent Document 3] United States Patent Application Publication No. 2011/0156027
[Patent Document 4] United States Patent Application Publication No. 2011/0182110

SUMMARY OF THE INVENTION

It is an object of one embodiment of the present invention to provide a memory device that is formed using a semiconductor with an irreversible conductivity type and a bandgap of 2.5 electron volts or more, such as an oxide semiconductor, is sufficiently integrated, and is capable of retaining data for a needed period even during interruption of power from an external power supply. It is another object of one embodiment of the present invention to provide a memory device with a novel structure or a method for driving the memory device, particularly a memory device whose power consumption can be reduced or a method for driving the memory device.

The terms used in this specification for the description of the present invention are briefly described. First, when one of a source and a drain of a transistor is called a drain, the other is called a source in this specification. That is, they are not distinguished depending on the potential level. Therefore, a portion called a source in this specification can be alternatively referred to as a drain.

Further, even when the expression "connect" is used in this specification, in an actual circuit, there is a case in which no physical connection is made and a wiring is just extended. For example, in a transistor circuit, one wiring may serve as the gates of a plurality of transistors. This may be shown in the circuit diagram as one wiring divided into several branches going to the gates. Even in this case, the expression "a wiring is connected to a gate" may be used in this specification.

One embodiment of the present invention is a semiconductor memory device including a column driver, one or more bit lines, one or more word lines, one or more memory cells, a bit line controlling transistor, and a bit line controlling circuit. The memory cell includes a transistor and a capacitor. A source of the transistor is connected to the bit line. A drain of the transistor is connected to one electrode of the capacitor. A gate of the transistor is connected to the word line. A source of the bit line controlling transistor is connected to the bit line. A drain of the bit line controlling transistor is connected to the column driver. A gate of the bit line controlling transistor is connected to the bit line controlling circuit. The bit line controlling circuit is connected to one electrode of a device configured to independently generate potential.

One embodiment of the present invention is a semiconductor memory device including a column driver, one or more bit lines, one or more word lines, one or more memory cells, a bit line controlling transistor, and a bit line controlling circuit. The memory cell includes a transistor and a capacitor. A source of the transistor is connected to the bit line. A drain of the transistor is connected to one electrode of the capacitor. A gate of the transistor is connected to the word line. The bit line is connected to the column driver. The bit line has the bit line controlling transistor at one end. A gate of the bit line controlling transistor is connected to the bit line controlling circuit. The bit line controlling circuit is connected to one electrode of a device configured to independently generate potential.

One embodiment of the present invention is a semiconductor memory device including a column driver, one or more bit lines, one or more word lines, one or more memory cells, a bit line controlling transistor, and a bit line controlling circuit. The memory cell includes a transistor and a capacitor. A source of the transistor is connected to the bit line. A drain of the transistor is connected to one electrode of the capacitor. A gate of the transistor is connected to the word line. The bit line is connected to the column driver. The bit line controlling transistor is inserted in the bit line in series. A gate of the bit line controlling transistor is connected to the bit line controlling circuit. The bit line controlling circuit is connected to one electrode of a device configured to independently generate potential.

In the above-described semiconductor memory devices, two or more bit line controlling transistors may be inserted in the bit line. Moreover, the gate of the bit line controlling transistor may be connected, via an n-channel transistor in the bit line controlling circuit, to a negative electrode of the device configured to independently generate potential. Further, the drain of the transistor in a memory cell may be connected to a gate of another transistor in that memory cell.

Furthermore, one or more sense amplifiers may be inserted in the bit line. In addition, the bit line controlling circuit may include an inverter, and an output of the inverter may be connected to the gate of the bit line controlling transistor.

Moreover, it is preferable that the minimum potential of the bit line be higher than the minimum potential of the word line by 1 V or more. Further, it is preferable that the maximum potential of the gate of the bit line controlling transistor be higher than the maximum potential of the word line by 1 V or more. Furthermore, it is preferable that the minimum potential of the bit line controlling transistor be lower than the potential of any other portion.

One embodiment of the present invention is a semiconductor memory device including a row driver, a column driver, one or more bit lines, one or more word lines, and one or more memory cells. The memory cell includes a transistor and a capacitor. A source of the transistor is connected to the bit line. A drain of the transistor is connected to one electrode of the capacitor. A gate of the transistor is connected to the word line. A transistor having a source connected to a device configured to independently generate potential is provided at a connecting point between the row driver and the word line.

One embodiment of the present invention is a semiconductor memory device including a row driver, a column driver, one or more bit lines, one or more word lines, and one or more memory cells. The memory cell includes a transistor and a capacitor. A source of the transistor is connected to the bit line. A drain of the transistor is connected to one electrode of the capacitor. A gate of the transistor is connected to the word line. One transistor in the row driver has a drain connected to the word line, and a source connected to a device configured to independently generate potential.

In the above-described semiconductor memory devices, one or more transistors may be present between the source of the one transistor in the row driver and the device configured to independently generate potential. Moreover, the source of the one transistor in the row driver may be connected to a negative electrode of the device configured to independently generate potential. Further, the drain of the transistor in the memory cell may be connected to a gate of another transistor. Furthermore, the one transistor in the row driver may be included in an inverter. In addition, the one transistor in the row driver may be an n-channel transistor.

Moreover, it is preferable that the minimum potential of the bit line be higher than the minimum potential of the word line by 1 V or more. Further, it is preferable that the minimum potential of the word line be lower than the potential of any other portion.

A device configured to independently generate potential may be a battery or a capacitor. That is, such a device may be an element with electromotive force or an element that can keep a potential without external electrical effects.

Note that the foregoing applies to the case where the transistor in the memory cell and the bit line controlling transistor are n-channel transistors. In the case where the transistor in the memory cell and the bit line controlling transistor are p-channel transistors, the above-described potential combination is reversed; the one expressed with "high" and the one expressed with "low" in the above description are expressed with "low" and "high", respectively, and the one expressed with "maximum" and the one expressed with "minimum" in the above description are expressed with "minimum" and "maximum", respectively.

The bit line controlling circuit is designed such that the potential of a gate of the bit line controlling transistor is set to a sufficiently negative value when power from the external power supply is interrupted. The bit line controlling circuit includes a battery or any other similar voltage generator (e.g., a capacitor) in order to output a negative potential.

The off-state current of the bit line controlling transistor can be sufficiently reduced by using a semiconductor with a wide bandgap as described above. The gate of the bit line controlling transistor is connected to the bit line controlling circuit and is set at a negative potential when power from the external power supply is interrupted. Therefore, when power from the external power supply is interrupted, very high resistance occurs between the source and the drain of the bit line controlling transistor.

In one embodiment of the present invention described above, the bit line controlling transistor is provided, for example, between the column driver and the bit line to put the bit line in a floating state; thus, the potential of the bit line can be kept constant. If the potential of the bit line is a constant value, the drain current can be sufficiently reduced even when the gate of the transistor in the memory cell has a potential of 0 V.

The potential of the bit line, which changes according to written or read data, is set to the value $V_1$ (>0) or more while the semiconductor memory device is powered by the external power supply. It is assumed here that the potential of the bit line is $V_1$. While the semiconductor memory device is powered by the external power supply, the potential of the gate of the bit line controlling transistor is an appropriate positive value (e.g., $V_2$ (>0)), so that the bit line controlling transistor is in the on-state.

If power from the external power supply is interrupted here, the semiconductor memory device detects the interruption of power and sets the potential of the gate of the bit line controlling transistor to a sufficiently negative value (e.g., $V_3$ (<0)). Consequently, the bit line controlling transistor is turned off. When the potentials of many portions of the semiconductor memory device sufficiently decrease, the potential of the column driver becomes 0 V, so that the potential of a source of the bit line controlling transistor also becomes 0 V.

However, the bit line controlling transistor is turned off at the same time as interruption of power from the external power supply, so that the potential of the bit line (the drain of the bit line controlling transistor) remains at $V_1$. Here, if the potential of the gate of the bit line controlling transistor is a sufficiently negative value, the potential of the bit line can be retained at a value close to $V_1$ for a very long period of time.

The bit line is connected to the memory cell 105. While the semiconductor memory device is powered by the external power supply, the potential of the drain of the transistor in the memory cell, which changes according to written data, is $V_1$ or more because the potential of the bit line is $V_1$ or more. It is assumed here that the potential of the drain of the transistor is $V_4$ ($\geq V_1$).

After interruption of power from the external power supply, the potential of the bit line is $V_1$ as described above, so that the potential of the source of the transistor in the memory cell is $V_1$. On the other hand, the potential of the word line (the potential of the gate of the transistor in the memory cell) becomes 0 V owing to interruption of power from the external power supply. The drain current of the transistor in the memory cell in this state is equivalent to that in the case where the potential of the source is set to 0 V and the potential of the gate is set to $-V_1$. In other words, by setting $V_1$ to an appropriate value, the drain current becomes a very low value and charge in the capacitor can be retained for a sufficient period of time.

That is, by inserting the bit line controlling transistor in the bit line, the potential of the bit line can be retained at an appropriate positive value for a sufficient period of time even during interruption of power from the external power supply. Thus, the semiconductor memory device can exhibit sufficient data retention characteristics even when using cell transistors with a variety of channel lengths and threshold voltages at a wider range of temperatures.

Since the bit line controlling transistor is inserted in the bit line in serial, its resistance in the on-state is desirably as low as possible. An effective way to accomplish this is to increase the potential of the gate of the bit line controlling transistor. For example, the potential of the gate of the bit line controlling transistor is preferably higher than the maximum potential of the gate of another transistor (e.g., the maximum potential of the word line) by 1 V or more.

With the above-described structure, the potential of the word line can be set to a sufficiently negative value when power from the external power supply is interrupted. When power from the external power supply is interrupted, the potential of the column driver becomes 0 V, but the off-resistance of the cell transistor in the memory cell can be sufficiently increased if the potential of the word line is a sufficiently negative value. Consequently, even when power from the external power supply is interrupted, the semiconductor memory device can exhibit sufficient data retention characteristics even when using cell transistors with a variety of channel lengths and threshold voltages at a wider range of temperature.

BRIEF DESCRIPTION OF THE DRAWINGS

FIGS. 5A to 5C are diagrams illustrating an example of the operation of the semiconductor memory device according to the present invention.

DETAILED DESCRIPTION OF THE INVENTION

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

Embodiment 1

Figure 1A:
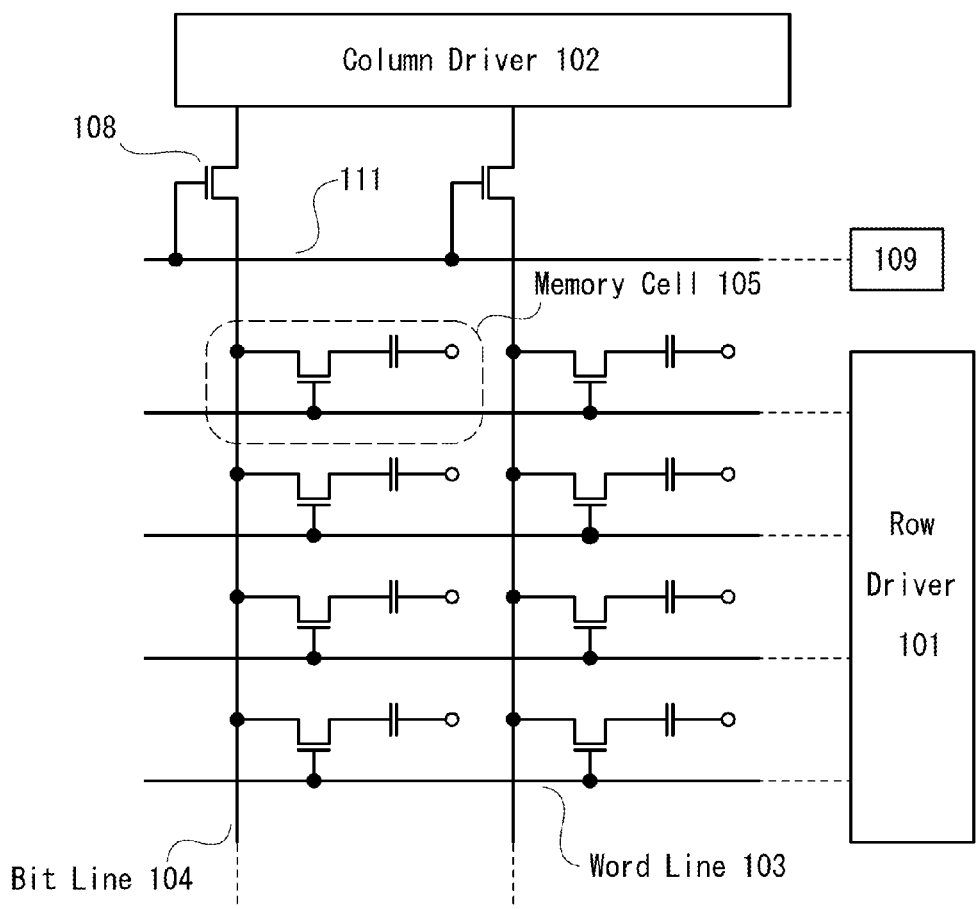
FIGS. 1A and 1B are diagrams illustrating an example of a semiconductor memory device according to the present invention.
Figure 2A:
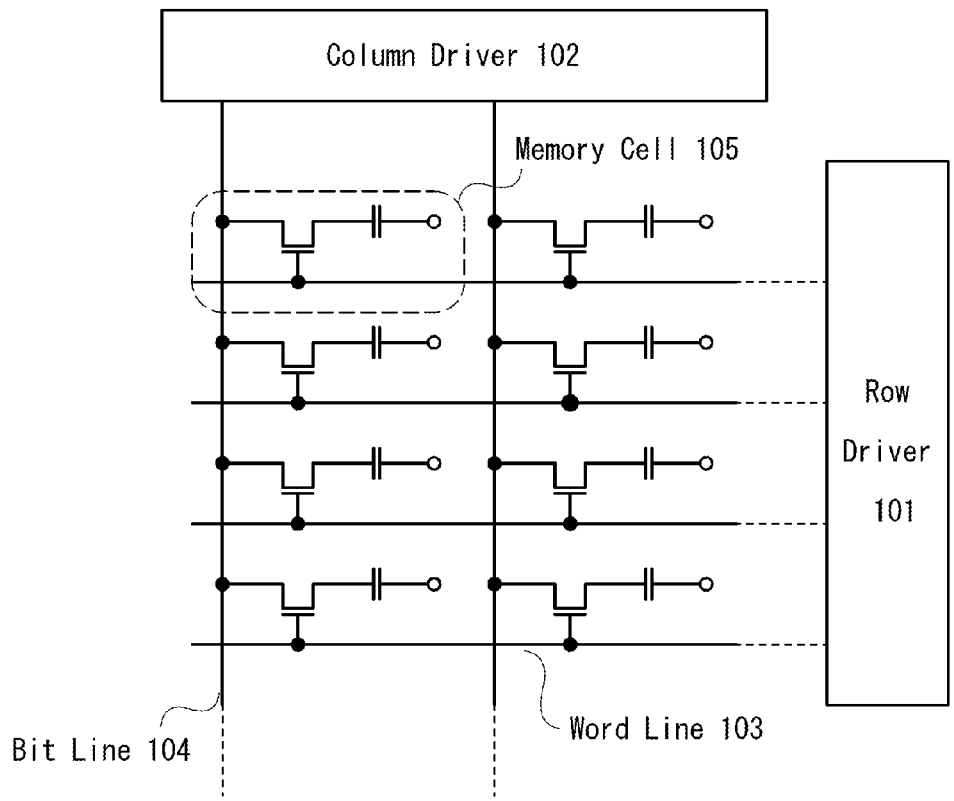
FIGS. 2A and 2B are diagrams illustrating an example of a conventional semiconductor memory device.
Figure 2B:
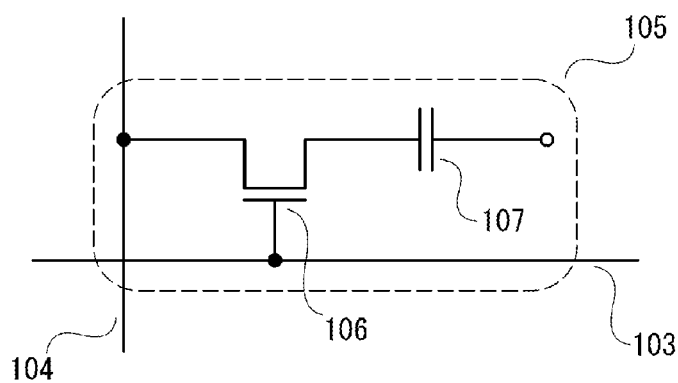

This embodiment describes a semiconductor memory device in FIG. 1A. The semiconductor memory device in FIG. 1A includes a row driver 101, a column driver 102, a plurality of word lines 103 connected to the row driver 101, a plurality of bit lines 104 (indirectly) connected to the column driver 102, and memory cells 105 each provided at the intersection of the word line 103 and the bit line 104. This structure is the same as that of the conventional DRAM in FIGS. 2A and 2B.

The semiconductor memory device in FIG. 1A further includes bit line controlling transistors 108 each inserted between the column driver 102 and the bit line 104. It can also be said that the bit line controlling transistor 108 is inserted in the bit line 104.

It can also be said that a source of the bit line controlling transistor 108 is connected to the column driver 102, and a drain of the bit line controlling transistor 108 is connected to the bit line 104. It can also be said that the bit line controlling transistor 108 is inserted between the column driver 102 and the memory cell 105 that is the closest to the column driver 102.

A gate of the bit line controlling transistor 108 is connected to a bit line controlling line 111. The potential of the bit line controlling line 111 is determined by a bit line controlling circuit 109. When the semiconductor memory device is powered by an external power supply and is determined to be usable, the bit line controlling circuit 109 supplies the bit line controlling line 111 with an appropriate potential to turn on the bit line controlling transistor 108.

The potential of the bit line, which changes according to written or read data, is set to a positive value, e.g., +1 V or more, while the semiconductor memory device is powered by the external power supply.

Then, when interruption of power from the external power supply is detected, or termination of the use of the semiconductor memory device is detected even while the semiconductor memory device is powered by the external power supply, the bit line controlling circuit 109 sets the potential of the bit line controlling line 111 to a sufficiently negative value of 0 V or less (e.g., −1 V) to rapidly turn off the bit line controlling transistor 108.

Since the bit line controlling transistors 108 are turned off, the bit lines 104 are insulated from the column driver, and the potentials (+1 V or more) of the bit lines 104 are retained. On the other hand, the power supply voltage of the row driver is 0 V, so that the potential of the word lines 103 is 0 V. Consequently, the potential of the gate of the cell transistor 106 in the memory cell 105 is sufficiently lower than that of the source. Thus, the off-resistance of the cell transistor 106 is sufficiently high, which enables the charge in the capacitor 107 to be retained for a long period of time.

Figure 1B:
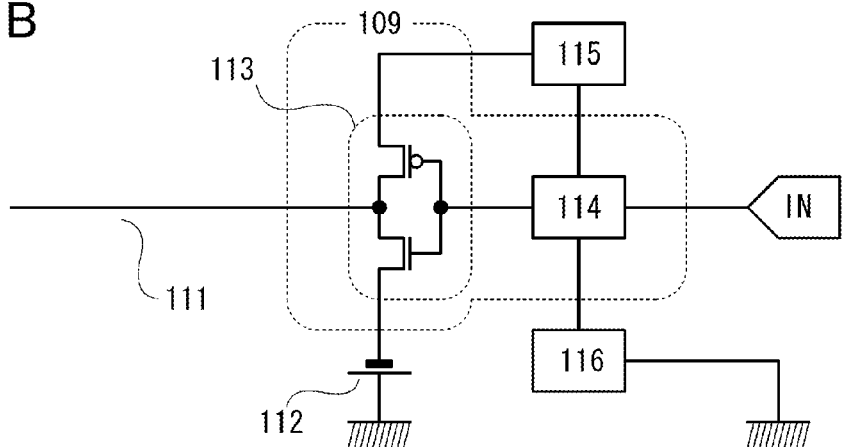

An example of the bit line controlling circuit 109 is illustrated in FIG. 1B. The bit line controlling circuit 109 shown here includes an inverter 113 and a control signal generation circuit 114. The control signal generation circuit 114 is connected to a high potential power supply 115 and a low potential power supply 116 and supplies a potential from either of these supplies to the inverter 113 in response to a signal IN input to the control signal generation circuit 114. Note that the high potential power supply 115 and the low potential power supply 116 may be provided either outside of the bit line controlling circuit 109 and in the semiconductor memory device, or inside the bit line controlling circuit 109. A source of an n-channel transistor in the inverter 113 is connected to a battery 112. In the description below, it is assumed that the threshold voltage of the n-channel transistor in the inverter 113 is +0.5 V, while the threshold voltage of the p-channel transistor is −0.5 V.

An example of the operation of the bit line controlling circuit 109 will be described with reference to FIGS. 5A to 5C. FIG. 5A illustrates the state where the semiconductor memory device is powered by the external power supply. Here, the potential of the high potential power supply 115 is +3 V, the potential of the low potential power supply 116 is −1 V, the potential of the negative electrode of the battery 112 is −1 V, and the potential of the positive electrode of the battery 112 is 0 V. Because the control signal generation circuit 114 outputs a potential of −1 V, the input and the output of the inverter 113 are −1 V and +3 V, respectively. Therefore, the bit line controlling transistor 108 connected to the bit line controlling line 111 is in the on-state.

When any change occurs in the conditions (e.g., interruption of power from the external power supply, or termination of the use of the semiconductor memory device), the control signal generation circuit 114 outputs a potential of +3 V (see FIG. 5B). Consequently, the input and the output of the inverter 113 become +3 V and −1 V, respectively, and the potential of the gate of the bit line controlling transistor 108 connected to the bit line controlling line 111 goes lower than that of the source of the bit line controlling transistor 108 by as high as 1 V; thus, the bit line controlling transistors 108 is put in an absolute (or sufficient) off-state.

After the bit line controlling transistor 108 is put in an absolute off-state, continuity between the column driver 102 and the bit line 104 is broken by the bit line controlling transistor 108, allowing the potential of the bit line 104 to be retained for a long period of time.

For example, some time after the interruption of power from the external power supply, both the potential of the high potential power supply 115 and the potential of the low potential power supply 116 become 0 V as illustrated in FIG. 5C. As a result, the output of the control signal generation circuit 114 also becomes 0 V. Even in this case, however, the output of the inverter 113 is −1 V, so that the bit line controlling transistor 108 can remain in an absolute off-state.

In the inverter 113, slight current (standby current) flows between the high potential side (the high potential power supply 115) and the low potential side (the battery 112) even under the non-operating state, but this current can be several picoamperes or less. In this embodiment, one inverter (one bit line controlling circuit 109) is provided for one column driver 102; thus, to ensure 10-year operation, for example, a capacity of only 0.1 μAh is needed.

Here, a direct-path current due to a change in the output of the inverter 113 is not taken into account. The polarity of the output of the inverter 113 is only changed by switching the memory device between the operating state and the non-operating state. For this reason, in most cases, the frequency of changes in the polarity of the inverter 113 is lower than once per second, and may be estimated to be about once per hour. Therefore, direct-path current may be hardly taken into account.

Even in the case where many bit line controlling circuits 109, e.g., 1000 bit line controlling circuits 109 are provided for one semiconductor memory device, needed capacity is only 0.1 mAh. A battery with such capacity can be mounted in a normal semiconductor chip. Note that, in reality, one bit line controlling circuit 109 is sufficient for one semiconductor memory device because even when a plurality of bit line controlling lines 111 is provided, they can operate in the same manner.

Note that the time required for changing the potential of a wiring connected to the output of the inverter depends on the capacitance of the wiring and the channel width of the transistors in the inverter. The larger the channel width of the transistors in the inverter is, the shorter the time required for changing the potential of the wiring, but also the greater the amount of standby current. In addition, the higher the capacitance of the wiring is, the longer the time required for changing the potential of the wiring.

In the case where a plurality of bit line controlling lines 111 is controlled by one inverter, the capacitance of wirings connected to the inverter is high and the channel width of the transistors in the inverter is small, which poses a problem of lower speed. However, it is acceptable that the time required for changing the potential applied to the bit line controlling line 111 (in the above example, the time required for changing the potential from +2 V to −1 V) is 100 or more times (in some cases, 10000 or more times) the time required for writing and reading the memory cell. Therefore, the small channel width of the transistors in the inverter poses no practical problems. The use of such transistors with a small channel width yields sufficiently reduced standby current.

Embodiment 2

A semiconductor memory device according to this embodiment will be described with reference to FIG. 3. The semiconductor memory device in FIG. 3 has sense amplifiers 117 inserted in bit lines 104. The sense amplifier 117 is used to divide the bit line 104 into appropriate lengths to lower the bit line capacitance (mainly the parasitic capacitance of the bit line) during read operation so that read accuracy can be increased.

With the sense amplifier 117 inserted in the bit line 104 in this manner, for example when power from an external power supply is interrupted, the charge in the bit line 104 flows out also through the sense amplifier 117. As a result, when power from the external power supply is interrupted, the potential of the bit line 104 connected to the sense amplifier decreases to 0 V.

Therefore, it is necessary to prevent charge in the bit lines 104 from flowing out when power from the external power supply is interrupted, by providing the bit line controlling transistors such that the sense amplifier 117 is sandwiched therebetween.

Figure 3:
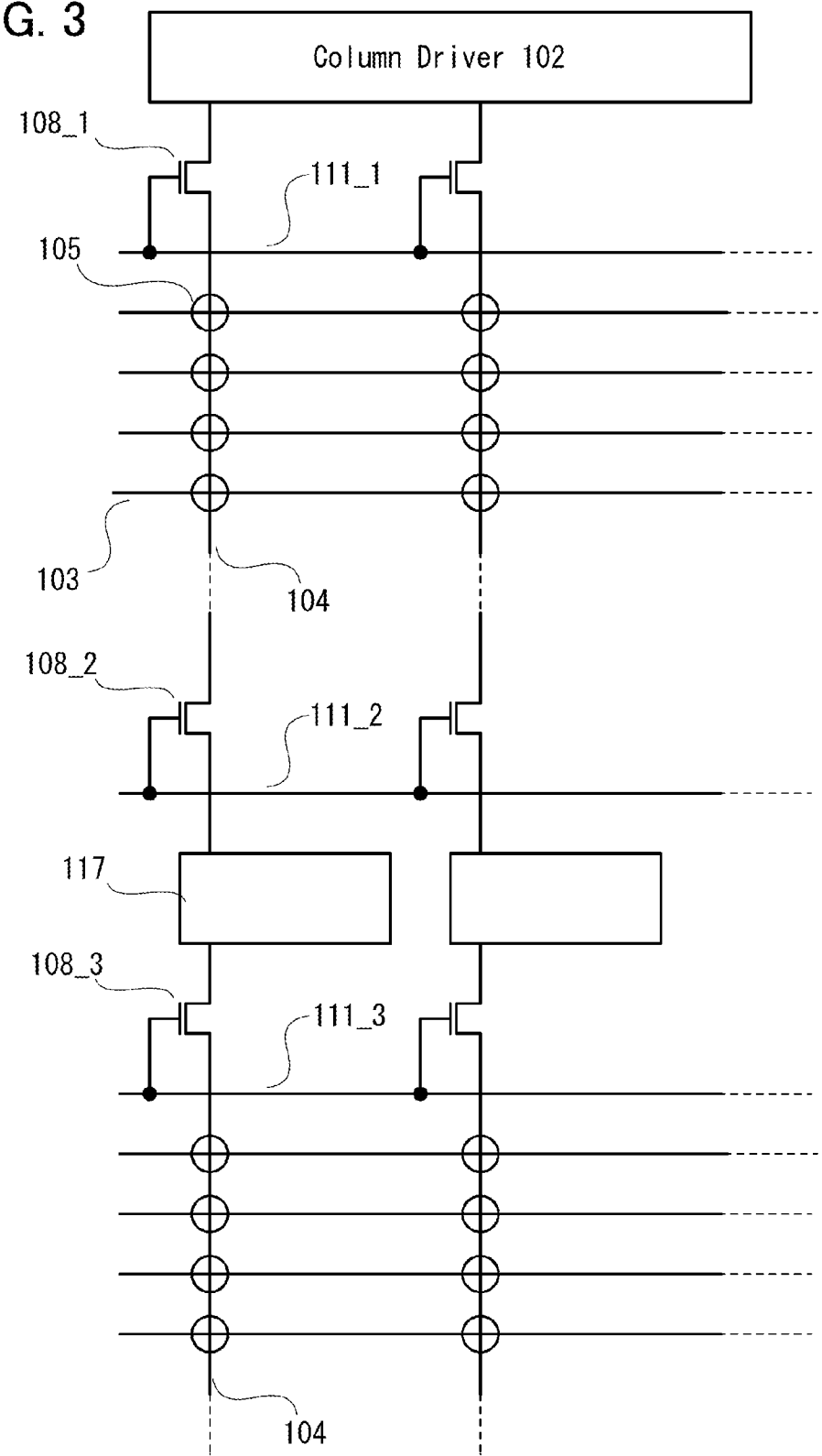
FIG. 3 is a diagram illustrating an example of a semiconductor memory device according to the present invention.

The semiconductor memory device in FIG. 3 includes a column driver 102, a plurality of word lines 103, a plurality of bit lines 104, and memory cells 105 each provided at the intersection of the word line 103 and the bit line 104. In addition, the sense amplifier 117 is inserted in the bit line 104.

Like the semiconductor memory device described in Embodiment 1, the semiconductor memory device in FIG. 3 further includes bit line controlling transistors 108_1 each inserted between the column driver 102 and the bit line 104. A gate of the bit line controlling transistor 108_1 is connected to a bit line controlling line 111_1. The bit line controlling line 111_1 is connected to a bit line controlling circuit similar to the bit line controlling circuit 109 according to Embodiment 1.

The semiconductor memory device in FIG. 3 further includes bit line controlling transistors 108_2 and bit line controlling transistors 108_3 each provided between the sense amplifier 117 connected to the bit line 104 and the memory cell 105 that is the closest to the sense amplifier 117. A gate of the bit line controlling transistor 1082 is connected to a bit line controlling line 111_2, and a gate of the bit line controlling transistor 108_3 is connected to a bit line controlling line 111_3. The bit line controlling lines 111_2 and 111_3 are connected to bit line controlling circuits. Note that the bit line controlling lines 111_1, 111_2, and 111_3 may be connected to one bit line controlling circuit.

In such a semiconductor memory device, the potentials of the bit line controlling lines 111_1 to 111_3 change according to conditions in a manner similar to that in Embodiment 1. In other words, when the semiconductor memory device is powered by an external power supply and is usable, the bit line controlling lines 111_1 to 111_3 are supplied with such a potential that the bit line controlling transistors 108_1 to 108_3 are turned on.

In contrast, when power from the external power supply is interrupted or when the use of the semiconductor memory device is terminated even while the semiconductor memory device is powered by the external power supply, the bit line controlling lines 111_1 to 111_3 are supplied with such a potential that the bit line controlling transistors 108_1 to 108_3 are turned off.

For example, when power from the external power supply is interrupted, the potential of the bit line controlling lines 111_1 to 111_3 rapidly becomes a sufficiently negative value of 0 V or less to turn off the bit line controlling transistors 108_1 to 108_3. Consequently, the bit line 104 is divided by the bit line controlling transistors 108_1 to 108_3. Thus, even if the potential of portions of the bit line 104 connected to the column driver 102 and the sense amplifier 117 becomes 0 V, the potential of the other portions (portions connected to the memory cells 105) can remain at an appropriate value.

On the other hand, because the potential of the word line 103 is 0 V, the cell transistor in the memory cell has sufficiently high resistance, and thus enables charge in the capacitor to be retained for a long period of time.

Embodiment 3

A semiconductor memory device in FIGS. 4A and 4B will be described. Memory cells 120 in the semiconductor memory device in FIGS. 4A and 4B have the same configuration as those described in Patent Document 4. Refer to Patent Document 4 for the operation and the like of the memory cells 120.

Figure 4A:
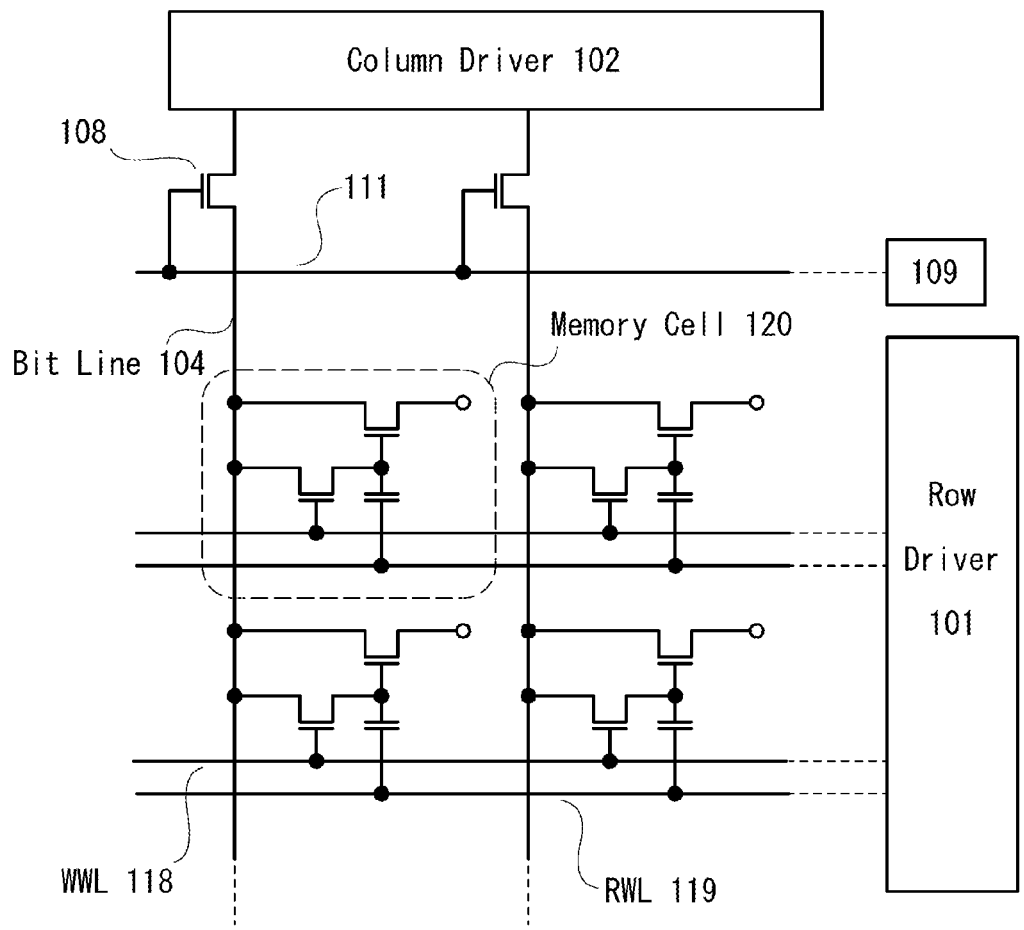
FIGS. 4A and 4B are diagrams illustrating an example of a semiconductor memory device according to the present invention.
Figure 4B:
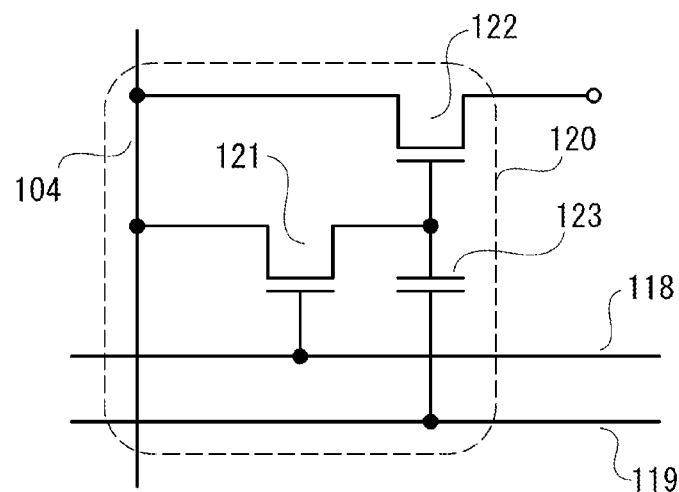
Figure 6A:
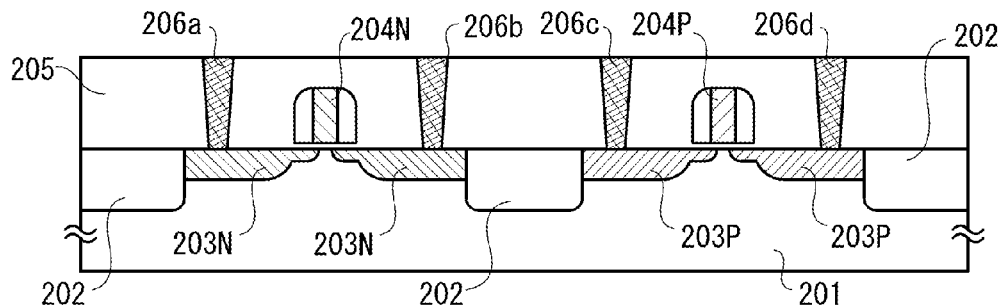
FIGS. 6A to 6C are diagrams illustrating an example of a process for manufacturing the semiconductor memory device according to the present invention.
Figure 6B:
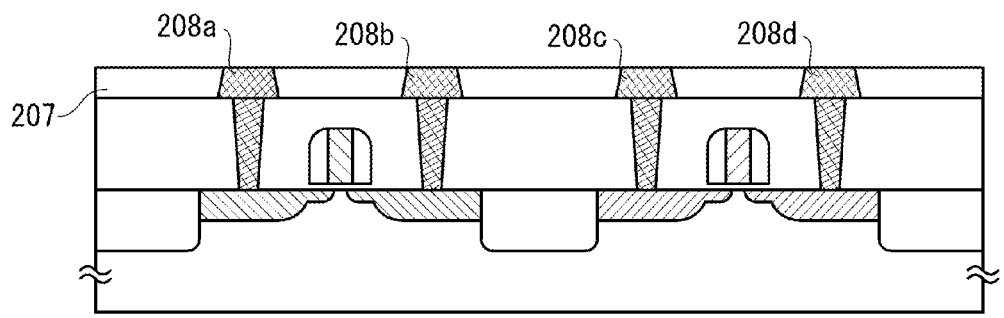
Figure 6C:
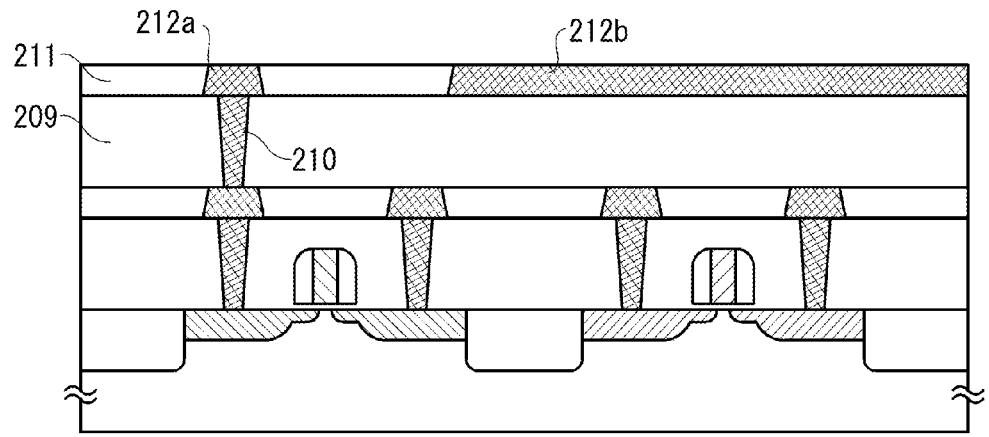
Figure 7A:
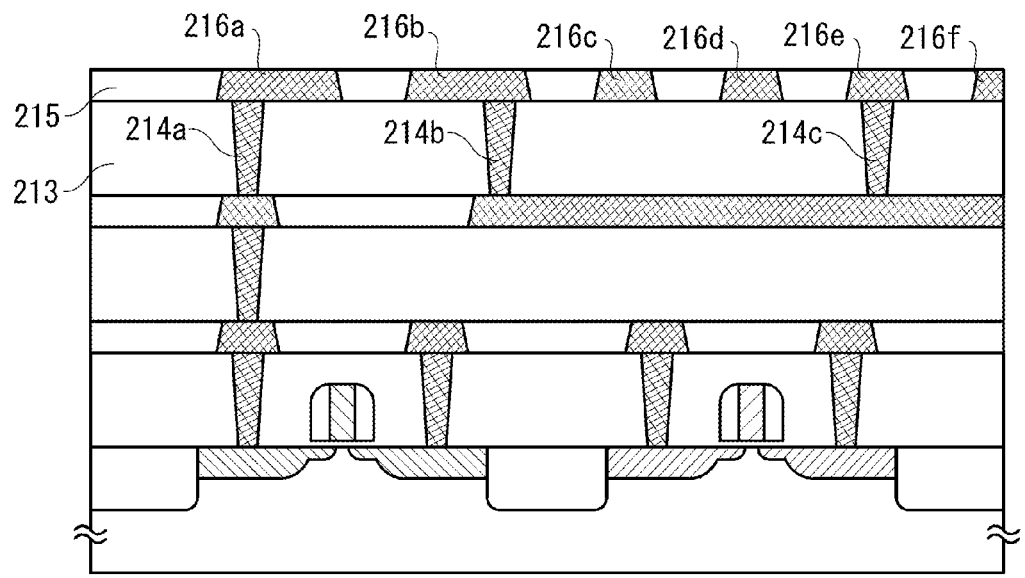
FIGS. 7A and 7B are diagrams illustrating an example of a process for manufacturing the semiconductor memory device according to the present invention.
Figure 7B:
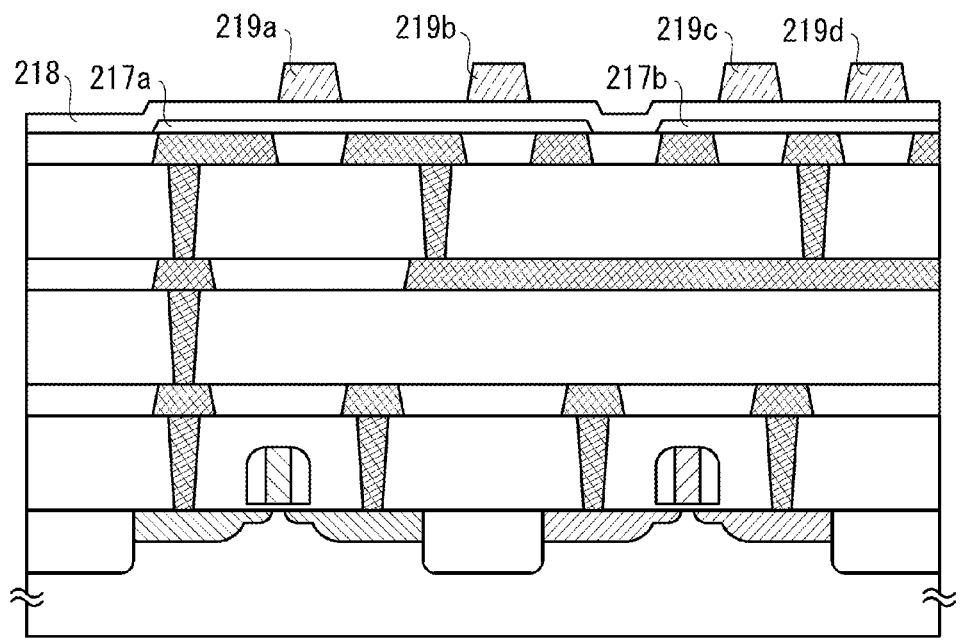
Figure 8:
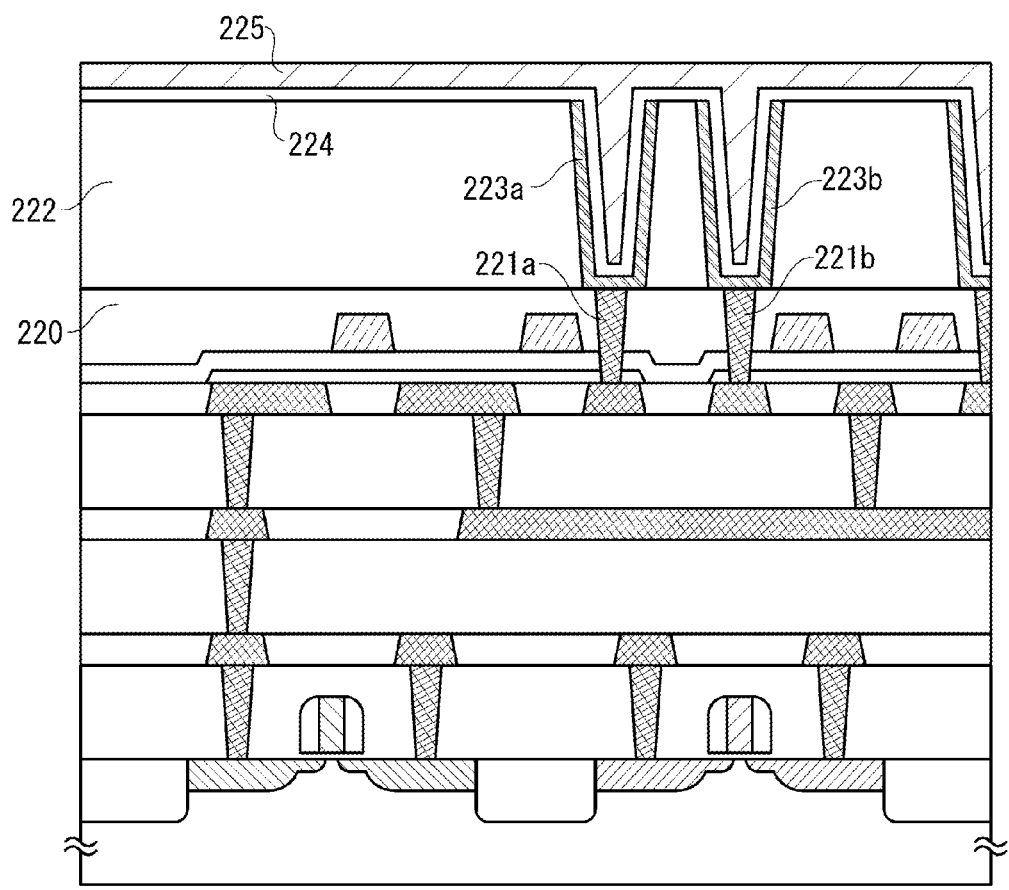
FIG. 8 is a diagram illustrating an example of a process for manufacturing the semiconductor memory device according to the present invention.
Figure 9A:
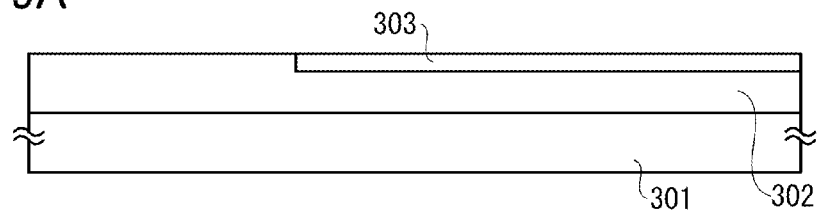
FIGS. 9A to 9D are diagrams illustrating an example of a process for manufacturing the semiconductor memory device according to the present invention.
Figure 9B:
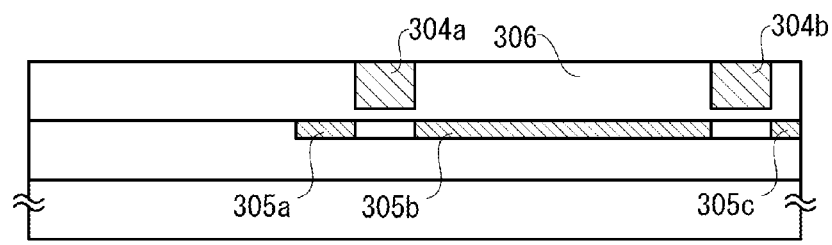
Figure 9C:
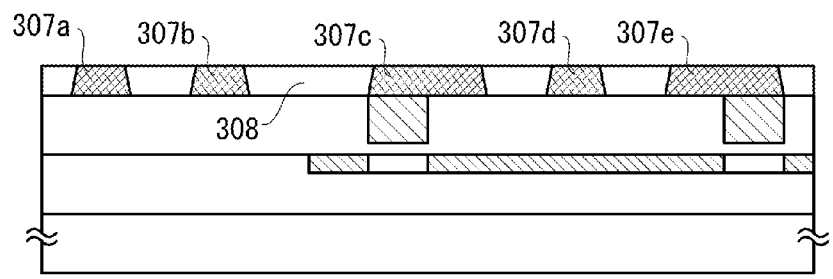
Figure 9D:
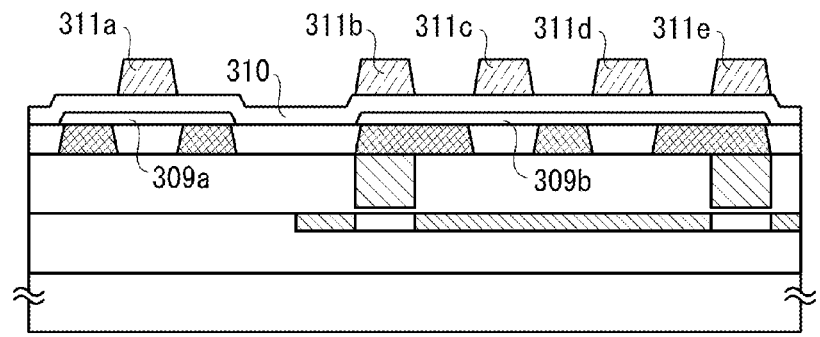

As illustrated in FIG. 4B, the memory cell 120 according to this embodiment includes a write transistor 121, a read transistor 122, and a capacitor 123. A source of the write transistor 121 and a source of the read transistor 122 are connected to a bit line 104. A gate of the write transistor 121 is connected to a write word line 118. A drain of the write transistor 121 and a gate of the read transistor 122 are connected to one electrode of the capacitor 123. The other electrode of the capacitor 123 is connected to a read word line 119.

The potentials of the write word lines 118 and the read word lines 119 are controlled by a row driver 101. The potential of the bit line 104 is controlled by a column driver 102.

While there are such many differences between the memory cell 105 according to Embodiment 1 or 2 and the memory cell 120 according to this embodiment, these memory cells are the same in that the source of the write transistor 121 (which corresponds to the cell transistor 106 in the memory cell 105 in FIG. 1A) is connected to the bit line 104 and the drain of the write transistor 121 is connected to one electrode of the capacitor 123. In other words, for data retention, the write transistor 121 needs to exhibit high resistance in the off-state.

Thus, in a manner similar to that in Embodiments 1 and 2, the potential of the bit line 104 is set to a sufficiently high value (e.g., +1 V or more), and bit line controlling transistors 108 each inserted between the column driver 102 and the bit line 104 are provided, which allows the write transistor 121 to have sufficiently high resistance even when power from an external power supply is interrupted (see FIG. 4A). A gate of the bit line controlling transistor 108 is connected to a bit line controlling line 111. The bit line controlling line 111 is connected to a bit line controlling circuit 109 similar to that shown in Embodiment 1.

In such a semiconductor memory device, the potential of the bit line controlling line 111 changes according to conditions in a manner similar to that in Embodiment 1. In other words, when the semiconductor memory device is powered by the external power supply and is usable, the bit line controlling line 111 is supplied with such a potential that the bit line controlling transistor 108 is turned on.

In contrast, when power from the external power supply is interrupted or when the use of the semiconductor memory device is terminated even while the semiconductor memory device is powered by the external power supply, the bit line controlling line 111 is supplied with such a potential that the bit line controlling transistor 108 is turned off.

For example, when power from the external power supply is interrupted, the potential of the bit line controlling line 111 rapidly becomes a sufficiently negative value of 0 V or less (e.g., −1 V) to turn off the bit line controlling transistor 108. Consequently, the potential of the bit line 104 can remain at an appropriate value.

On the other hand, because the potential of the write word line 118 is 0 V, the write transistor 121 in the memory cell 120 has sufficiently high resistance, and thus enables charge in the capacitor 123 to be retained for a long period of time.

The memory cell 120 is characterized by being capable of amplifying a signal with the read transistor 122 and output the amplified signal to the bit line even if the capacitance of the capacitor 123 is low. However, the fact that the capacitance of the capacitor 123 is low means that it is difficult to retain data for a required time if the resistance of the write transistor 121 in the off-state is not sufficiently high. Therefore, keeping, during power interruption, the potential of the bit line 104 at an appropriate positive value with the bit line controlling transistor 108 to increase the resistance of the write transistor 121 in the off-state is particularly effective in this embodiment.

Embodiment 4

A brief description is given of a process for manufacturing the semiconductor memory device illustrated, for example, in FIGS. 1A and 1B or FIG. 3 with reference to FIGS. 6A to 6C, FIGS. 7A and 7B, and FIG. 8. Refer to known semiconductor integrated circuit manufacturing techniques for the details. Note that FIGS. 6A to 6C, FIGS. 7A and 7B, and FIG. 8 illustrate the concepts of the manufacturing process and do not show specific cross sections.

<FIG. 6A>

First, device isolation insulators 202, n-type impurity regions 203N, p-type impurity regions 203P, an n-channel transistor gate 204N, a p-channel transistor gate 204P, a first interlayer insulator 205, first contact plugs 206a to 206d, and the like are formed over a surface of a substrate 201 of a semiconductor or the like by known semiconductor integrated circuit manufacturing techniques. The n-channel transistor or the p-channel transistor here may be used in a row driver, a column driver, a bit line controlling circuit, a sense amplifier, or the like in a semiconductor memory device.

<FIG. 6B>

Next, first layer wirings 208a to 208d are formed so as to be embedded in a first embodiment insulator 207. These wirings are used, for example, in the row driver 101, the column driver 102, and the bit line controlling circuit 109 in FIGS. 1A and 1B, or the sense amplifier 117.

<FIG. 6C>

Further, a second interlayer insulator 209, a second contact plug 210, a second embodiment insulator 211, second layer wirings 212a and 212b are formed. Note that one or more layers including another wiring may be additionally provided between a layer including the second layer wirings 212a and 212b and a layer including the first layer wirings 208a to 208d.

<FIG. 7A>

Further, a third interlayer insulator 213, third contact plugs 214a to 214c, a third embodiment insulator 215, and third layer wirings 216a to 216f are formed. Note that the first contact plug 206a, the first layer wiring 208a, the second contact plug 210, the second layer wiring 212a, the second layer wiring 212b, the third contact plug 214a, the third contact plug 214b, the third layer wiring 216a, and the third layer wiring 216b serve as part of the bit line 104 in FIGS. 1A and 1B.

<FIG. 7B>

Subsequently, an oxide semiconductor layer 217a and an oxide semiconductor layer 217b are formed, and a gate insulator 218 is formed so as to cover them. At this time, it is preferable that the physical thickness of the gate insulator 218 be twice or more that of the oxide semiconductor layer 217a and the oxide semiconductor layer 217b, because this enables the oxide semiconductor layer 217a and the oxide semiconductor layer 217b to be covered with the gate insulator 218 reliably, thereby preventing shorts between wirings.

On the other hand, it is preferable that the effective thickness of the gate insulator (e.g., the equivalent oxide thickness) be less than or equal to that of the oxide semiconductor layer 217a and the oxide semiconductor layer 217b. Therefore, it is preferable that the gate insulator 218 be formed of a material whose dielectric constant is twice or more that of the oxide semiconductor layer 217a and the oxide semiconductor layer 217b.

For example, the gate insulator 218 may be formed of a high dielectric constant material such as hafnium oxide, tantalum oxide, or zirconium oxide. Materials such as barium oxide, strontium oxide, calcium oxide, and lithium oxide which form silicides on silicon semiconductor have been prevented from being used with silicon semiconductor, but may be used with an oxide semiconductor without problems. Therefore, any of these materials can be used for the gate insulator 218 as long as it has high dielectric constant.

Then, fourth layer wirings 219a to 219d are formed. The fourth layer wiring 219a here corresponds to the gate of the bit line controlling transistor 108 or the bit line controlling line 111 in FIG. 1A. The fourth layer wirings 219b to 219d correspond to the word lines 103 in FIG. 1A.

<FIG. 8>

Stacked capacitors are formed by known DRAM manufacturing techniques. Specifically, a fourth interlayer insulator 220, a fourth contact plug 221a, a fourth contact plug 221b, and the like are formed, and then a fifth interlayer insulator 222, a capacitor electrode 223a, a capacitor electrode 223b, and the like are formed thereover. Subsequently, a capacitor insulator 224 and a cell plate 225 are formed. Thus, the semiconductor memory device can be manufactured.

Embodiment 5

A brief description is given of a process for manufacturing the semiconductor memory device illustrated in FIGS. 4A and 4B with reference to FIGS. 9A to 9D and FIGS. 10A to 10C. Refer to known semiconductor integrated circuit manufacturing techniques or Patent Document 2 for the details. Note that FIGS. 9A to 9D and FIGS. 10A to 10C illustrate the concepts of the manufacturing process and do not show specific cross sections.

<FIG. 9A>

First, a BOX layer 302 and an SOI layer 303 are formed over a surface of a substrate 301 of a semiconductor or the like by known semiconductor integrated circuit manufacturing techniques.

<FIG. 9B>

Next, read gates 304a and 304b are formed, and an impurity is added to the SOI layer 303 by using these gates as a mask to form impurity regions 305a to 305c. The read gates 304a and 304b correspond to the gates of the read transistors 122 in FIGS. 4A and 4B. Then, a first interlayer insulator 306 is formed and then is planarized to expose top surfaces of the read gates 304a and 304b.

<FIG. 9C>

First layer wirings 307a to 307e and a first embodiment insulator 308 are formed.

<FIG. 9D>

Subsequently, an oxide semiconductor layer 309a and an oxide semiconductor layer 309b are formed, and a gate insulator 310 is formed so as to cover them. Then, second layer wirings 311a to 311e are formed. The second layer wiring 311a here corresponds to the gate of the bit line controlling transistor 108 or the bit line controlling line 111 in FIG. 4A. The second layer wirings 311c and 311d correspond to the write word lines 118 in FIGS. 4A and 4B. The second layer wirings 311b and 311e correspond to the read word lines 119 in FIGS. 4A and 4B.

<FIG. 10A>

A second interlayer insulator 312 with a plane surface is formed. Then, contact plugs 313a, 313b, and 313c connected to the first layer wirings 307a, 307b, and 307d are formed.

<FIG. 10B>

Third layer wirings 314a and 314b are formed. The third layer wirings 314a and 314b correspond to the bit line 104 in FIG. 4A.

<FIG. 10C>

A third interlayer insulator 315 is formed. Any other wirings, interlayer insulators, and the like may additionally be formed. Through the aforementioned process, a semiconductor memory device including a bit line controlling transistor 316, a read transistor 317, a write transistor 318, and a capacitor 319 is formed. The bit line controlling transistor 316 corresponds to the bit line controlling transistor 108 in FIG. 4A.

The read transistor 317, the write transistor 318, and the capacitor 319 form one memory cell. The read transistor 317, the write transistor 318, and the capacitor 319 correspond to the read transistor 122, the write transistor 121, and the capacitor 123 in FIG. 4B, respectively.

Figure 10A:
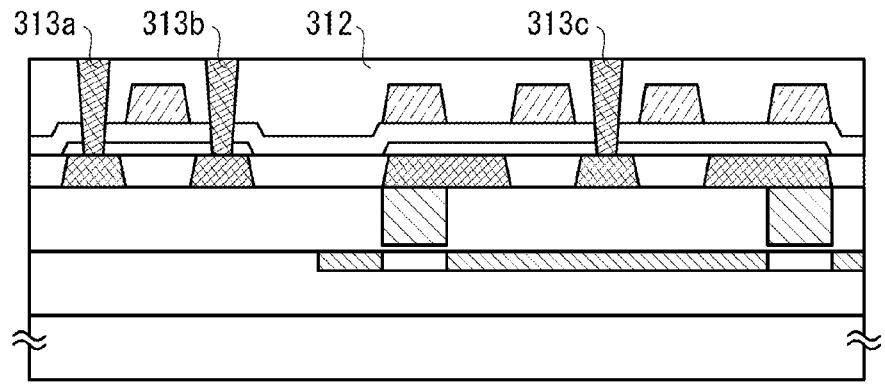
FIGS. 10A to 10C are diagrams illustrating an example of a process for manufacturing the semiconductor memory device according to the present invention.
Figure 10B:
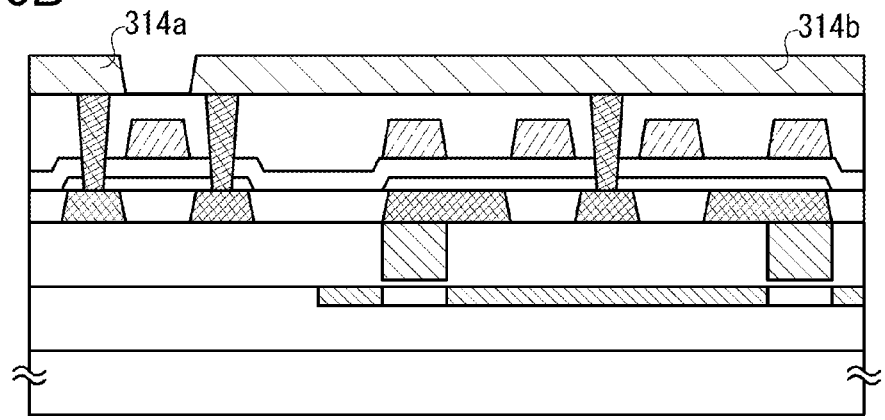
Figure 10C:
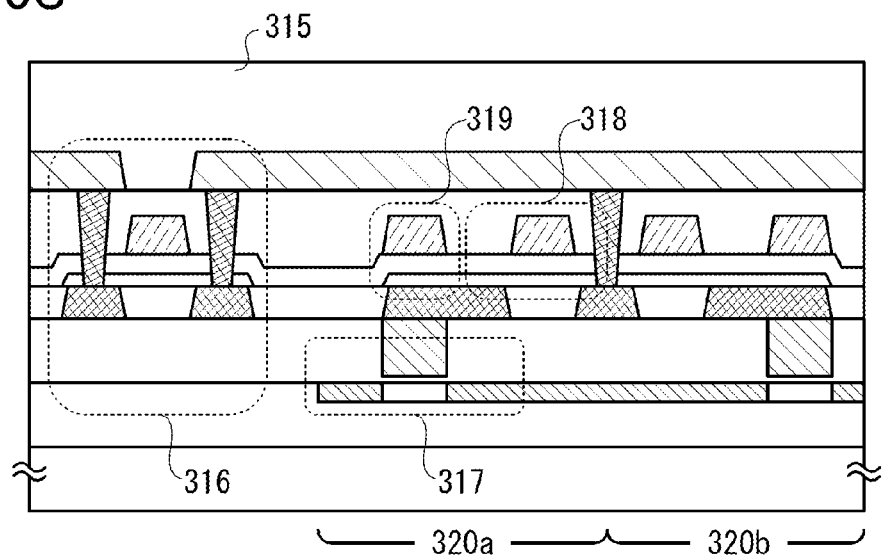

Note that FIG. 10C illustrates two memory cells (a memory cell 320a and a memory cell 320b). These memory cells are connected to the same bit line.

Embodiment 6

Figure 11A:
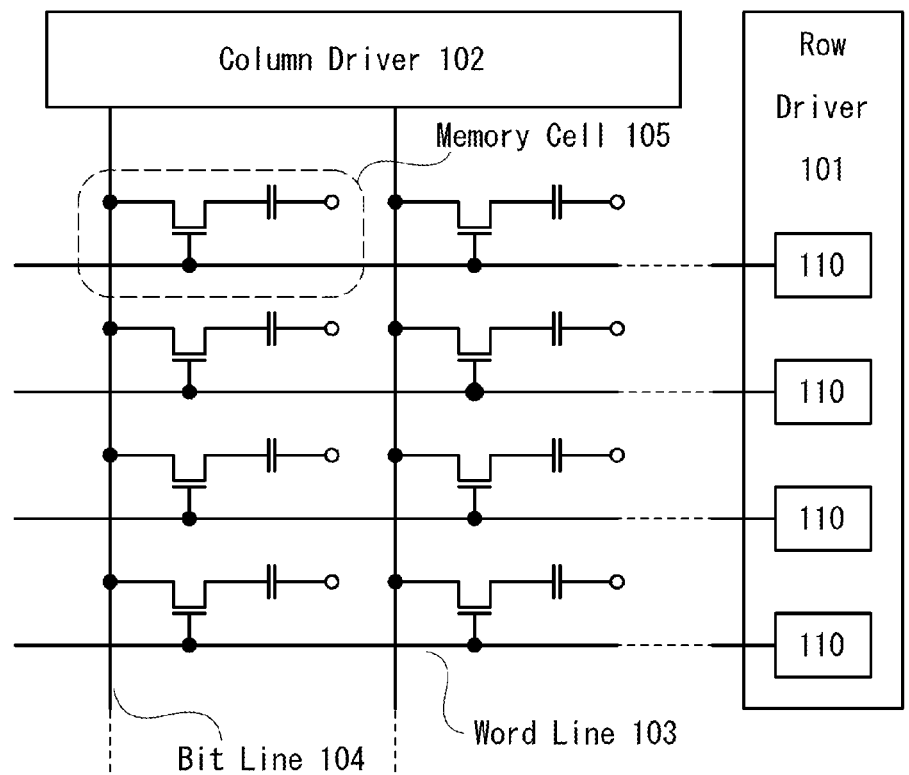
FIGS. 11A and 11B are diagrams illustrating an example of a semiconductor memory device according to the present invention.

This embodiment describes a semiconductor memory device in FIG. 11A. The semiconductor memory device in FIG. 11A includes a row driver 101, a column driver 102, a plurality of word lines 103 connected to the row driver 101, a plurality of bit lines 104 connected to the column driver 102, and memory cells 105 each provided at the intersection of the word line 103 and the bit line 104. This structure is the same as that of the conventional DRAM in FIG. 2.

In a semiconductor memory device illustrated in FIG. 11A, word line output circuits 110 are provided in a row driver 101. The word line output circuit 110 is connected to a word line 103. The potential of the word line 103 is determined by the word line output circuit 110. The word line 103 is at a high potential while a corresponding memory cell 105 is selected, and is at a low potential (a sufficiently negative potential in this embodiment) during the other time periods.

When interruption of power from the external power supply is detected, the word line output circuit 110 sets the potential of the word line 103 to a sufficiently negative value of 0 V or less to turn off cell transistors.

The word line output circuit 110 has the same structure as the bit line controlling circuit 109 in FIG. 1B. While the output of the bit line controlling circuit 109 is connected to the bit line controlling line 111, the output of the word line output circuit 110 is connected to the word line 103. See FIGS. 5A to 5C for the operation of the word line output circuit 110 because it is similar to that of the bit line controlling circuit 109.

Figure 11B:
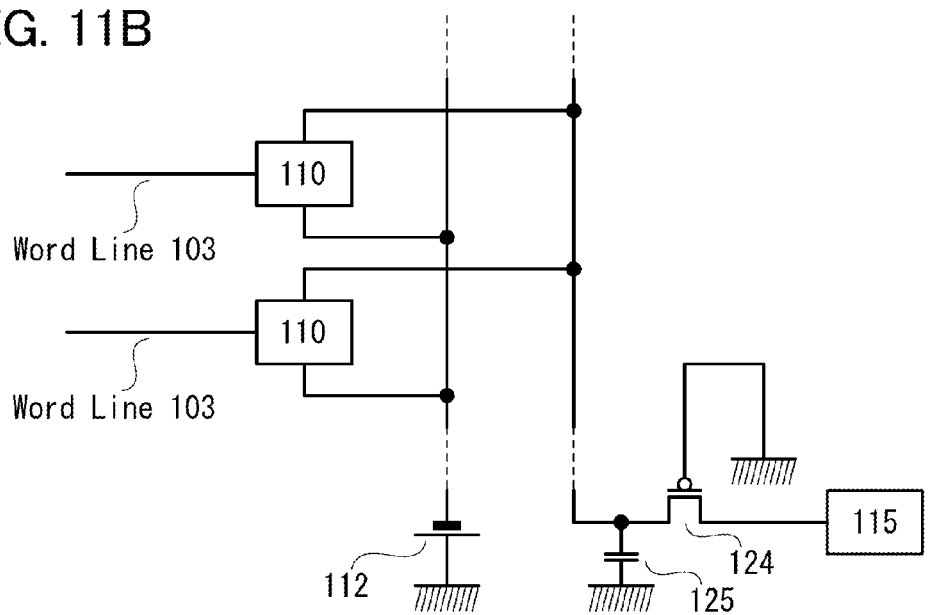

In this embodiment, one word line output circuit 110 is provided for one word line 103. Connections between a plurality of word line output circuits 110, a battery 112, and a high potential power supply 115 are illustrated in FIG. 11B. A plurality of inverters 113 is connected in parallel between the battery 112 and the high potential power supply 115. For example, when a million word lines exist in one semiconductor memory device, a million inverters 113 may be connected in parallel between the battery 112 and the high potential power supply 115.

Like in the bit line controlling circuit 109, in the word line output circuit 110, slight current (standby current) flows even under the non-operating state, but this current can be reduced to only several picoamperes or less per word line output circuit 110. However, since the word line output circuits 110 are connected in parallel between the battery 112 and the high potential power supply 115 as described above, the capacity of the battery required for 10 years is about 90 mAh, assuming that a million word lines is used.

To solve this problem, a control transistor 124 may be inserted between the word line output circuit 110 and the high potential power supply 115. The control transistor 124 is on while the memory device is powered by an external power supply, and is turned off when the potential of high potential power supply 115 becomes 0 V when power from the external power supply is interrupted. The control transistor 124 may be a p-channel transistor.

A description is now given of the requisite on-resistance of the control transistor 124. The on-resistance of the control transistor 124 is preferably low, because when it is high, the potential of the inverter 113 decreases. A decrease in the potential is desirably, for example, 10% or less of the potential difference between the high potential power supply 115 and the low potential power supply 116.

Most current flowing through the control transistor 124 while the memory device is powered by the external power supply is used for charging and discharging of the word line 103. Therefore, the current flowing through the control transistor 124 can be estimated from the parasitic capacitance of each word line 103 and the response speed of the memory device. Note here that not all the word lines 103 have constantly changing potentials, and only a few of the word lines 103 have changing potentials.

In the case of a semiconductor memory device with a response speed of 10 nanoseconds, for example, the potentials of the word lines 103 in entire the semiconductor memory device are changed 100 million times per second. Assuming that the parasitic capacitance of each word line 103 is 40 fF, a charge of 4 μC passes through the control transistor 124 per second, so that the current flowing through the control transistor 124 is 4 μA.

In order that the voltage drop due to this current can be 0.1 V or less, the on-resistance of the control transistor 124 should be 25 kΩ or less. This can be accomplished by a transistor having the same size as a transistor used in the inverter 113, and can be ensured by a transistor whose channel width is 10 times that of a transistor used in the inverter 113. The off-resistance of a transistor whose channel width is 10 times that of a transistor used in the inverter 113 is one-tenth of that of a transistor used in the inverter 113 (about 0.1 TΩ=$1\times10^{11}$Ω).

In the foregoing discussion, it is noted that the on-resistance and off-resistance of the control transistor 124 and the capacity of the battery 112 are determined not by the number of memory cells 105 (or the number of word lines 103) in the semiconductor memory device but by the response speed of the semiconductor memory device and the capacitance of each word line 103. This means that, at the same response speed of the semiconductor memory device, the requisite capacity of the battery 112 is the same regardless of the number of memory cells.

To stabilize the potential supplied to the inverter 113, a capacitor 125 one electrode of which is connected between the control transistor 124 and the inverter 113 may be provided. The capacitance of the capacitor 125 is preferably greater than 1 pF and less than 1 nF.

Next, the effect of the control transistor 124 is described. During interruption of power from the external power supply, the inverter is in the standby mode and the control transistor 124 is in the off-state. Here, it is assumed that the resistance of each inverter 113 in the standby mode is 1 TΩ and the off-resistance of the control transistor 124 is 0.1 TΩ.

The number of inverters 113 is the same as the number of word lines. Since the inverters 113 are connected in parallel, the total resistance thereof is 1 MΩ assuming that a million word lines are provided. The resistance between the high potential power supply 115 and the battery 112 is about 0.1 TΩ, the sum of the total resistance of the inverters 113 and the off-resistance of the control transistor 124. In other words, the off-resistance of the control transistor 124 accounts for the most part of the resistance between the high potential power supply 115 and the battery 112.

The potential difference between a source and a drain of the control transistor 124 is 1 V, resulting in a current of 10 pA. In other words, the battery capacity required for 10 years is about 0.9 μAh, which is about one hundred-thousandth of that without the control transistor 124 (90 mAh).

When the size of the transistors in the inverter 113 is made significantly small as a result of semiconductor circuit miniaturization, the off-resistance cannot be sufficiently increased owing to short channel effects and may decrease to as low as about 1 nΩ, for example. In this case, the total off-resistance of the word line output circuits 110 (the parallel resistance of the inverters 113) decreases to as low as 1 kΩ.

In such a case, providing the control transistor 124 is effective. The minimum number of control transistors 124 needed for one semiconductor memory device is only one, which eliminates the need for the miniaturization, and thus enables sufficient off-resistance (0.1 TΩ or more). As described above, during interruption of power from the external power supply, the substantial resistance between the battery 112 and the high potential power supply 115 corresponds to the off-resistance of the control transistor 124, and therefore is not affected however low the parallel resistance of the inverters 113 is.

Note that power is also consumed by changing the potential of the word line 103 during rewrite and read operations. Consumed power depends on the parasitic capacitance of the word line. Assuming that the parasitic capacitance of each word line 103 is 40 fF, in a semiconductor memory device including a million word lines 103, the total parasitic capacitance of the word lines is 40 nF. Therefore, when the potentials of all the word lines 103 are changed from +2 V to −1 V, a negative charge of 0.12 μC flows out from the battery 112.

For this reason, in order to change the potentials of all the word lines from +2 V to −1 V 10 billion times (in the case where the memory cells on one word line are written and read 10 billion times, the number of writing and reading one memory cell corresponds to 10 million, assuming that there are 1000 memory cells on one word line), a charge of 1.2 kC is needed. This translates into a battery capacity of a little more than 330 mAh, which is higher than the above-stated capacity needed for 10-year retention.

Therefore, it is preferable that the battery 112 have a capacity that takes into account the number of write operations and read operations. Alternatively, it is preferable that the semiconductor memory device be configured such that write operation and read operation are limited or any alarm is triggered when the number of write operations and read operations approaches a limit. Such a battery 112 may be provided in the same package or module as the semiconductor memory device.

In the case where the potential of the word line 103 is not changed while the semiconductor memory device is powered by the external power supply, the resistance between the high potential power supply 115 and the battery 112 corresponds to the sum of the total resistance of the inverter 113 (1 MΩ) and the on-resistance of the control transistor 124 (10 kΩ); thus, unlike during interruption of power from the external power supply, the total resistance of the inverter 113 is dominant, which results in a relatively large current flow.

Assuming that the period during which the semiconductor memory device is powered by the external power supply is 10% of the total period, the capacity required for 10 years is about 26 mAh. However, when the resistance of the inverter 113 is reduced by a factor of 1000 as a result of circuit miniaturization, the capacity required for 10 years is increased by a factor of 1000. In such a case, it is preferable that the semiconductor memory device be configured, with the circuit shown in Embodiment 7, such that battery drain is prevented while the semiconductor memory device is powered by the external power supply.

The maximum power potential of the word line output circuit 110 in this embodiment can be made lower than +3 V, the maximum power potential of the bit line controlling circuit 109 described in Embodiment 1.

For example, when a change in the potential of the bit line 104 is supposed to be 1 V, in Embodiment 1, the maximum potential is +2 V because the minimum potential is +1 V. On the other hand, a potential higher than +2 V by the threshold voltage (+1 V) needs to be applied to the gate (bit line controlling line) in order to turn on the bit line controlling transistor 108; hence, the maximum power potential of the bit line controlling circuit 109 is +3 V.

In contrast, in this embodiment, the bit line 104 does not need to be separated from the column driver; thus, the minimum potential of the bit line 104 can be 0 V. When a change in the potential of the bit line 104 is supposed to be 1 V, the maximum potential is +1 V. A potential higher than +1 V by the threshold voltage (+1 V) needs to be applied to the gate (word line) in order to turn on the cell transistor 106; hence, the maximum power potential of the word line output circuit 110 is +2 V.

Embodiment 7

Figure 12A:
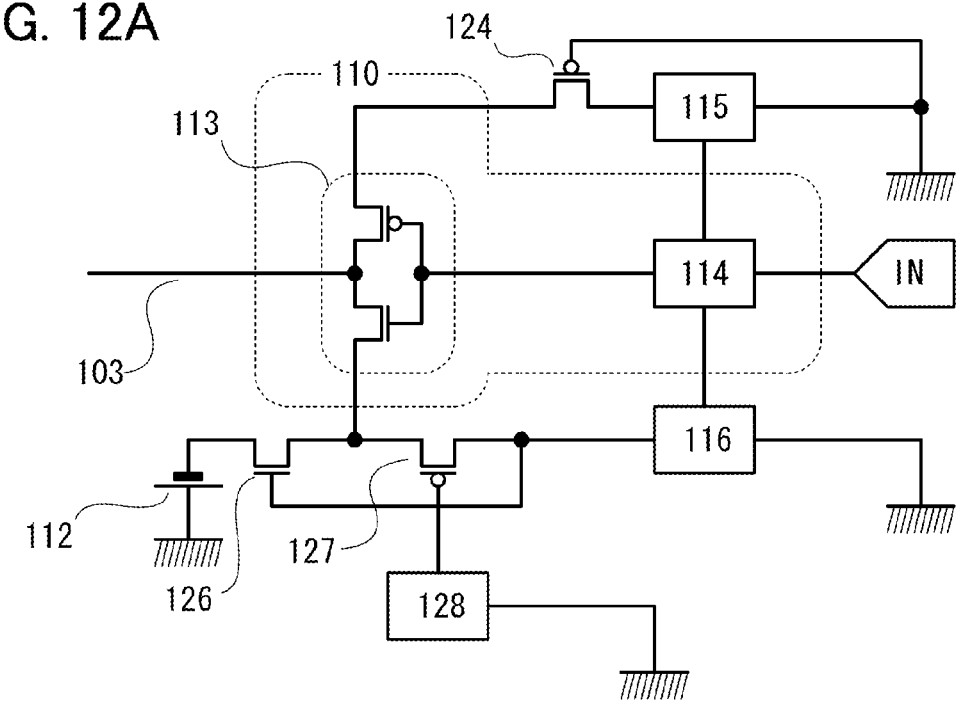
FIGS. 12A to 12C are diagrams illustrating an example of a semiconductor memory device according to the present invention and an example of the operation of the same.

This embodiment describes another example of a configuration of the semiconductor memory device described in Embodiment 6. FIG. 12A illustrates an example of a circuit including a word line output circuit 110 and circuits or elements connected to the word line output circuit 110. Here, the word line output circuit 110, a battery 112, an inverter 113, a control signal generation circuit 114, a high potential power supply 115, a low potential power supply 116, and a control transistor 124 are similar to those described in Embodiment 1 or 6. Note that the control transistor 124 is not necessarily provided.

The circuit illustrated in FIG. 12A further includes a control transistor 126, a control transistor 127, and an ultra low potential power supply 128. Here, the control transistor 126 is an n-channel transistor, and the control transistor 127 is a p-channel transistor.

The on-resistance of the control transistor 127 (i.e., the size of the transistor) can be determined in the manner discussed for the control transistor 124 in Embodiment 6. For example, the channel width of the control transistor 127 may be 10 times that of a transistor used in the inverter 113.

The control transistor 126 is required to be on during interruption of power from an external power supply and to have on-resistance sufficiently lower than (one-tenth or less of) the parallel resistance of the inverter 113, and thus is designed to have a resistance of 100 kΩ or less, for example. This is sufficiently higher than those of the control transistor 124 and the control transistor 127, resulting in high off-resistance (e.g., 1 TΩ or more).

In the case where the parallel resistance of the inverter 113 is reduced as a result of miniaturization, the on-resistances of the control transistor 124, the control transistor 126, and the control transistor 127 are required to decrease accordingly.

A drain of the control transistor 126 is connected to a negative electrode of the battery 112. A source of the control transistor 126 is connected to a source of an n-channel transistor in the inverter 113. A gate of the control transistor 126 is connected to the low potential power supply 116. A drain of the control transistor 127 is connected to the low potential power supply 116. A source of the control transistor 127 is connected to the source of the n-channel transistor in the inverter 113. A gate of the control transistor 127 is connected to the ultra low potential power supply 128. A drain of the control transistor 124 is connected to the high potential power supply 115. A source of the control transistor 124 is connected to a source of a p-channel transistor in the inverter 113. A gate of the control transistor 124 is grounded.

Note that the gate of the control transistor 126 or the gate of the control transistor 124 may be connected to an appropriate circuit other than that described above. The ultra low potential power supply 128 outputs lower potential than the low potential power supply 116 (here, a potential of −2 V) while the semiconductor memory device is powered by an external power supply.

Figure 12B:
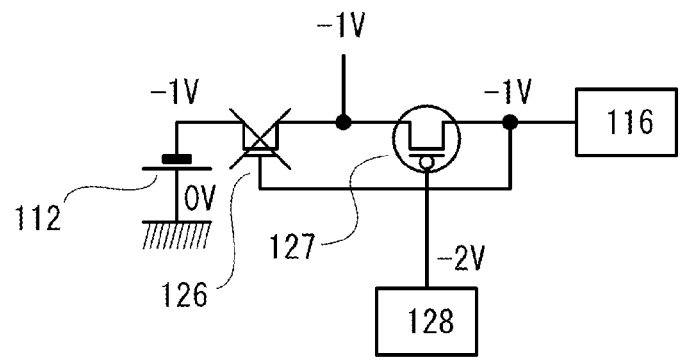

The following describes the operation of such a circuit. While the semiconductor memory device is powered by the external power supply, the output potential of the low potential power supply 116 is −1 V, and the output potential of the ultra low potential power supply 128 is −2 V. Hence, the control transistor 127 is on, while the control transistor 126 is off as illustrated in FIG. 12B. In other words, charge for changing the potential of the word line is supplied from the low potential power supply 116.

Although not illustrated in FIG. 12B, while the semiconductor memory device is powered by the external power supply, the control transistor 124 is on, and the potential of the source of the p-channel transistor in the inverter 113 is +2 V.

Figure 12C:
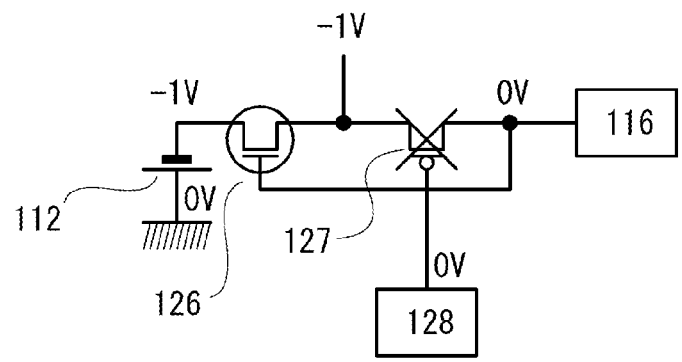

Then, power from the external power supply is interrupted, so that as shown in FIG. 12C, both the output potential of the low potential power supply 116 and the output potential of the ultra low potential power supply 128 become 0 V. Consequently, the control transistor 127 is turned off, while the control transistor 126 is turned on. Thus, the potential of the source of the n-channel transistor in the inverter 113 is maintained at −1 V even during interruption of power from the external power supply.

Note that as described in Embodiment 6, although not illustrated in FIG. 12C, the control transistor 124 is turned off when power from the external power supply is interrupted.

Even in this state, slight current flows between the high potential power supply 115 (whose potential is 0 V during interruption of power from the external power supply) and the battery 112 (whose potential is −1 V) through the control transistor 126 and the inverter 113, which drains the battery 112.

However, unlike in Embodiment 6, the battery 112 is not used during write operation or read operation, so that the battery 112 is less drained than in Embodiment 6. Since the battery 112 is not used during write operation or read operation, there is no limitation on the number of write operations or read operations.

While the semiconductor memory device is powered by the external power supply, the resistance between the battery 112 and the high potential power supply 115 corresponds to the sum of the on-resistance of the control transistor 124 (10 kΩ), the parallel resistance of the inverter 113 (1 MΩ), and the off-resistance of the control transistor 126 (1 TΩ), and the off-resistance of the control transistor 126 is dominant.

Even if the parallel resistance of the inverter 113 is reduced by a factor of 1000 as a result of circuit miniaturization, the resistance between the battery 112 and the high potential power supply 115 is hardly changed. Therefore, unlike in Embodiment 6, the battery 112 is hardly drained while the semiconductor memory device is powered by the external power supply.

In the case where the control transistor 124 is not provided, the capacity of the battery required for 10 years is about 90 mAh. As described in Embodiment 6, providing the control transistor 124 can reduce power consumption, thereby reducing the requisite capacity of the battery 112.

There is also current flowing between the battery and the low potential power supply 116 (whose potential is 0 V during interruption of power from the external power supply) through the control transistor 126 and the control transistor 127. The resistance between the battery and the low potential power supply 116, which corresponds to the sum of the on-resistance of the control transistor 126 and the off-resistance of the control transistor 127, is about 0.1 TΩ assuming that the off resistance of the control transistor 127 is 0.1 TΩ. The current flowing through this path for 10 years is about 0.9 μAh.

The sum of the current flowing through the control transistor 127 and the current flowing through the control transistor 124 for 10 years is several microampere-hours. For example, a solid state battery, an electric double layer capacitor, or the like formed over a chip over which the semiconductor memory device is formed can be used as the battery 112.

Embodiment 8

A semiconductor memory device illustrated in FIGS. 13A and 13B will be described. Memory cells 120 in the semiconductor memory device illustrated in FIGS. 13A and 13B have the same configuration as those in Embodiment 3. Refer to Patent Document 4 for the operation and the like of the memory cells 120.

Figure 13A:
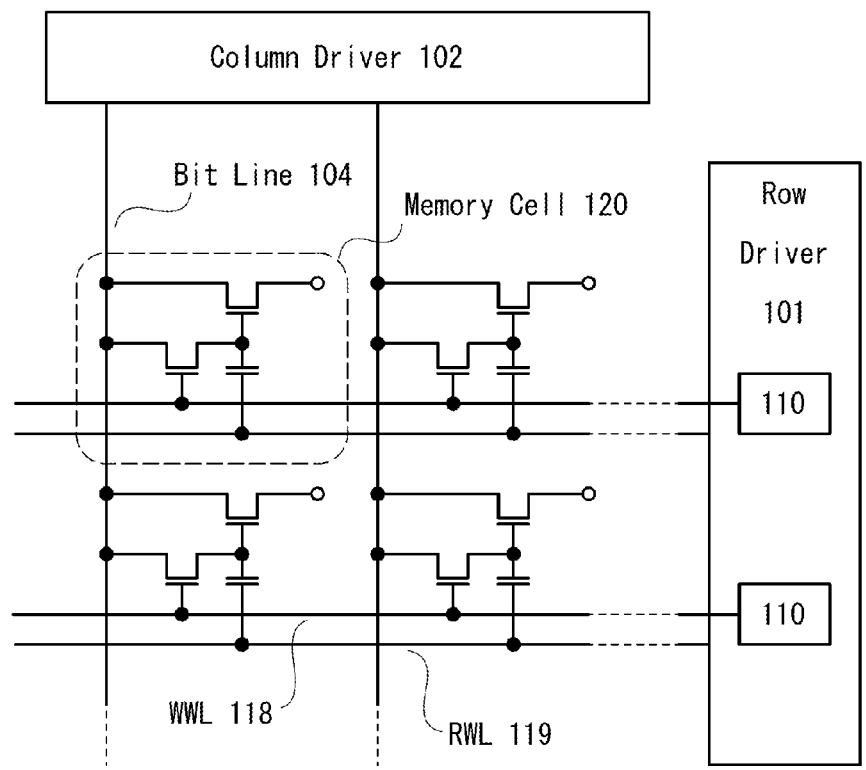
FIGS. 13A and 13B are diagrams illustrating an example of a semiconductor memory device according to the present invention.
Figure 13B:
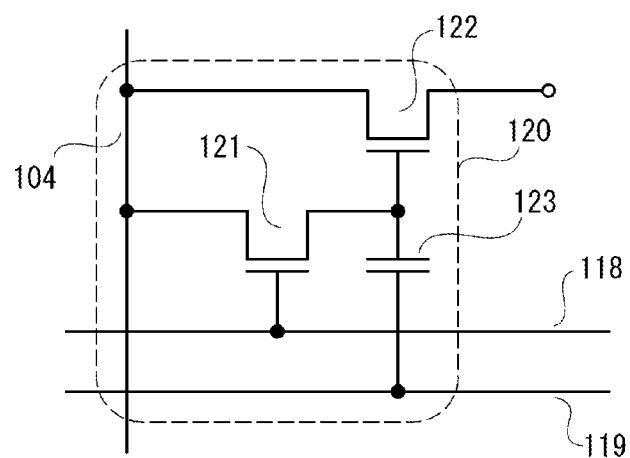

As illustrated in FIG. 13B, each memory cell 120 according to this embodiment includes a write transistor 121, a read transistor 122, and a capacitor 123. A source of the write transistor 121 and a source of the read transistor 122 are connected to a bit line 104. A gate of the write transistor 121 is connected to a write word line 118. A drain of the write transistor 121 and a gate of the read transistor 122 are connected to one electrode of the capacitor 123. The other electrode of the capacitor 123 is connected to a read word line 119.

The potentials of the write word lines 118 and the read word lines 119 are controlled by a row driver 101. The potentials of the bit lines 104 are controlled by a column driver 102.

While there are such many differences between the memory cell 105 according to Embodiment 6 and the memory cell 120 according to this embodiment, these memory cells are the same in that the source of the write transistor 121 (which corresponds to the cell transistor 106 in the memory cell 105 in FIG. 11A) is connected to the bit line 104 and the drain of the write transistor 121 is connected to one electrode of the capacitor 123. In other words, for data retention, the write transistor 121 needs to exhibit high resistance in the off-state.

Thus, in a manner similar to that in Embodiment 6, word line output circuits 110 are provided in a row driver 101 such that the potential of the write word lines 118 is maintained at a sufficiently low negative value even when power from an external power supply is interrupted (see FIG. 13A). In other words, when power from an external power supply is interrupted, the write word lines 118 can have a sufficiently negative potential such that the write transistor 121 has a sufficiently high resistance.

The memory cell 120 is characterized by being capable of amplifying a signal with the read transistor 122 and output the amplified signal to the bit line even if the capacitance of the capacitor 123 is low. However, the fact that the capacitance of the capacitor 123 is low means that it is difficult to retain data for a required time if the resistance of the write transistor 121 in the off-state is not sufficiently high. Therefore, keeping, during power interruption, the potential of the write word lines 118 at a sufficiently negative value to increase the resistance of the write transistors 121 is effective.

With the memory cells in FIGS. 13A and 13B, the potential of the write word line 118 is changed only during write operation, and is not required to be changed during a read operation. The frequency of read operations is generally higher than that of write operations; thus, the capacity of a battery connected to the word line output circuits 110 can be made lower than that with the memory cells shown in Embodiment 6. Note that the word line output circuit 110 may be the circuit (FIG. 12A) described in Embodiment 7.

This application is based on Japanese Patent Application serial No. 2011-129728 filed with Japan Patent Office on Jun. 10, 2011, and Japanese Patent Application serial No. 2011-129757 filed with Japan Patent Office on Jun. 10, 2011, the entire contents of which are hereby incorporated by reference.

What is claimed is:

1. A semiconductor device comprising:
   a column driver;
   a bit line;
   a word line;
   a memory cell;
   a bit line controlling transistor; and
   a bit line controlling circuit,
   wherein the memory cell includes a transistor and a capacitor,
   wherein a source of the transistor is connected to the bit line,
   wherein a drain of the transistor is connected to one electrode of the capacitor,
   wherein a gate of the transistor is connected to the word line,
   wherein a source of the bit line controlling transistor is connected to the bit line,
   wherein a drain of the bit line controlling transistor is connected to the column driver,
   wherein a gate of the bit line controlling transistor is connected to the bit line controlling circuit, and
   wherein the bit line controlling circuit is connected to one electrode of a device configured to independently generate potential.

2. The semiconductor device according to claim 1, wherein the gate of the bit line controlling transistor is connected, via an n-channel transistor in the bit line controlling circuit, to a negative electrode of the device configured to independently generate potential.

3. The semiconductor device according to claim 1, wherein the drain of the transistor is connected to a gate of another transistor.

4. The semiconductor device according to claim 1, wherein a minimum potential of the bit line is higher than a minimum potential of the word line by 1 V or more.

5. The semiconductor device according to claim 1, wherein one or more sense amplifiers are inserted in the bit line.

6. The semiconductor device according to claim 1,
   wherein the bit line controlling circuit includes an inverter, and
   wherein an output of the inverter is connected to the gate of the bit line controlling transistor.

7. The semiconductor device according to claim 1, wherein a maximum potential of the gate of the bit line controlling transistor is higher than a maximum potential of the word line by 1 V or more.

8. The semiconductor device according to claim 1, wherein the transistor and the bit line controlling transistor are formed using an oxide semiconductor.

9. The semiconductor device according to claim 1, wherein the transistor and the bit line controlling transistor are formed using a semiconductor with a bandgap of 2.5 electron volts or more.

10. The semiconductor device according to claim 1, wherein the device configured to independently generate potential is a battery.

11. A semiconductor device comprising:
a column driver;
a bit line;
a word line;
a memory cell;
a bit line controlling transistor; and
a bit line controlling circuit,
wherein the memory cell includes a transistor and a capacitor,
wherein a source of the transistor is connected to the bit line,
wherein a drain of the transistor is connected to one electrode of the capacitor,
wherein a gate of the transistor is connected to the word line,
wherein the bit line is connected to the column driver,
wherein the bit line has the bit line controlling transistor at one end,
wherein a gate of the bit line controlling transistor is connected to the bit line controlling circuit, and
wherein the bit line controlling circuit is connected to one electrode of a device configured to independently generate potential.

12. A semiconductor device comprising:
a column driver;
a bit line;
a word line;
a memory cell;
a bit line controlling transistor; and
a bit line controlling circuit,
wherein the memory cell includes a transistor and a capacitor,
wherein a source of the transistor is connected to the bit line,
wherein a drain of the transistor is connected to one electrode of the capacitor,
wherein a gate of the transistor is connected to the word line,
wherein the bit line is connected to the column driver,
wherein the bit line controlling transistor is inserted in the bit line in series,
wherein a gate of the bit line controlling transistor is connected to the bit line controlling circuit, and
wherein the bit line controlling circuit is connected to one electrode of a device configured to independently generate potential.

13. The semiconductor device according to claim 12, wherein two or more bit line controlling transistors are inserted in the bit line.

14. A semiconductor device comprising:
a row driver;
a column driver;
a bit line;
a word line; and
a memory cell;
wherein the memory cell includes a transistor and a capacitor,
wherein a source of the transistor is connected to the bit line,
wherein a drain of the transistor is connected to one electrode of the capacitor,
wherein a gate of the transistor is connected to the word line,
wherein a transistor having a source connected to a device configured to independently generate potential is provided at a connecting point between the row driver and the word line.

15. The semiconductor device according to claim 14, wherein the drain of the transistor in the memory cell is connected to a gate of another transistor.

16. The semiconductor device according to claim 14, wherein a minimum potential of the bit line is higher than a minimum potential of the word line by 1 V or more.

17. The semiconductor device according to claim 14, wherein the one transistor in the row driver is included in an inverter.

18. The semiconductor device according to claim 14 wherein the one transistor in the row driver is an n-channel transistor.

19. The semiconductor device according to claim 14, wherein the transistor in the memory cell is formed using an oxide semiconductor.

20. The semiconductor device according to claim 14, wherein the transistor in the memory cell is formed using a semiconductor with a bandgap of 2.5 electron volts or more.

21. The semiconductor device according to claim 14, wherein the device configured to independently generate potential is a battery.

22. A semiconductor device comprising:
a row driver;
a column driver;
a bit line;
a word line; and
a memory cell;
wherein the memory cell includes a transistor and a capacitor,
wherein a source of the transistor is connected to the bit line,
wherein a drain of the transistor is connected to one electrode of the capacitor,
wherein a gate of the transistor is connected to the word line,
wherein one transistor in the row driver has a drain connected to the word line, and a source connected to a device configured to independently generate potential.

23. The semiconductor device according to claim 14, wherein the source of the one transistor in the row driver is connected to a negative electrode of the device configured to independently generate potential.

* * * * *